US010832782B2

(12) United States Patent
Park

(10) Patent No.: US 10,832,782 B2
(45) Date of Patent: Nov. 10, 2020

(54) NONVOLATILE MEMORY DEVICE, STORAGE DEVICE INCLUDING NONVOLATILE MEMORY DEVICE, AND OPERATING METHOD OF NONVOLATILE MEMORY DEVICE

(71) Applicant: Samsung Electronics Co., Ltd., Suwon-si, Gyeonggi-do (KR)

(72) Inventor: Jooyong Park, Bucheon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/562,999

(22) Filed: Sep. 6, 2019

(65) Prior Publication Data
US 2020/0258580 A1 Aug. 13, 2020

(30) Foreign Application Priority Data
Feb. 13, 2019 (KR) .................. 10-2019-0016879

(51) Int. Cl.
*G11C 11/34* (2006.01)
*G11C 16/26* (2006.01)
*G11C 16/10* (2006.01)
*G11C 16/08* (2006.01)
*G11C 16/04* (2006.01)

(52) U.S. Cl.
CPC .......... *G11C 16/26* (2013.01); *G11C 16/0483* (2013.01); *G11C 16/08* (2013.01); *G11C 16/10* (2013.01)

(58) Field of Classification Search
CPC ......... G11C 16/10; G11C 16/30; G11C 16/12; G11C 16/0483

USPC .................................. 365/185.18, 185.19
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,953,376 B2 * | 2/2015 | Nam ................. | G11C 16/0483 365/185.11 |
| 9,142,313 B2 | 9/2015 | Shim et al. | |
| 9,190,151 B2 | 11/2015 | Nam et al. | |
| 9,312,008 B2 | 4/2016 | Nam | |
| 9,396,800 B2 | 7/2016 | Shim et al. | |
| 10,026,486 B1 | 7/2018 | Dutta et al. | |
| 10,043,580 B2 | 8/2018 | Nam et al. | |
| 2011/0233648 A1 | 9/2011 | Seol et al. | |
| 2018/0053554 A1 | 2/2018 | Nam et al. | |

(Continued)

*Primary Examiner* — Son T Dinh
(74) *Attorney, Agent, or Firm* — Harness, Dickey & Pierce, P.L.C.

(57) ABSTRACT

A nonvolatile memory device that performs a read operation during which row decoder circuitry applies a turn on voltage to a first ground selection line selected from a plurality of ground selection lines, applies a turn off voltage to at least one second ground selection line selected from the plurality of ground selection lines, the at least one second ground selection line being selected from the plurality of ground selection lines based on a read address associated with the read operation, and applies the turn off voltage to an unselected ground selection line among the plurality of ground selection lines after applying a prepulse voltage to the unselected ground selection line.

20 Claims, 16 Drawing Sheets

(56) References Cited

U.S. PATENT DOCUMENTS

2018/0218775 A1    8/2018  Kim et al.
2018/0254090 A1    9/2018  Dutta et al.
2018/0268907 A1*   9/2018  Shim .................. G11C 16/3427

* cited by examiner

NONVOLATILE MEMORY DEVICE, STORAGE DEVICE INCLUDING NONVOLATILE MEMORY DEVICE, AND OPERATING METHOD OF NONVOLATILE MEMORY DEVICE

CROSS-REFERENCE TO RELATED APPLICATION

This application claims priority under 35 U.S.C. § 119 to Korean Patent Application No. 10-2019-0016879, filed on Feb. 13, 2019, in the Korean Intellectual Property Office, the disclosure of which is hereby incorporated by reference in its entirety.

TECHNICAL FIELD

Example embodiments of the inventive concepts relate to a semiconductor circuit, and, more specifically, to a nonvolatile memory device configured to selectively apply a prepulse voltage to provide a balance between tradeoffs including data reliability, operation speed, and/or power consumption, a storage device including a nonvolatile memory device, and/or an operating method of a nonvolatile memory device.

DISCUSSION OF RELATED ART

A storage device stores data according to control of a host device, such as a computer, a smart phone, a smart pad, etc. The storage device includes a magnetic disk, such as a hard disk drive (HDD), and/or a semiconductor memory (e.g., nonvolatile memory), such as a solid state drive or a memory card.

Types of nonvolatile memory include read only memory (ROM), programmable ROM (PROM), electrically programmable ROM (EPROM), electrically erasable and programmable ROM (EEPROM), flash memory, phase change random access memory (PRAM), magnetic RAM (MRAM), resistive RAM (RRAM), ferroelectric RAM (FRAM), etc.

With development of a semiconductor manufacturing techniques, integration and capacity of nonvolatile memory devices, and a storage devices including the nonvolatile memory devices, has increased. Due to the high integration of the nonvolatile memory device, and the storage devices including the nonvolatile memory devices, a production cost thereof has been reduced.

The increasing integration of the nonvolatile memory device and the storage device leads to reduced size and structural changes. To suppress the reduction in data reliability of the nonvolatile memory devices, and the storage devices including the nonvolatile memory devices, various techniques are applied thereto.

However, the various techniques to suppress the reduction in data reliability of the nonvolatile memory devices, and the storage devices including the nonvolatile memory devices, may reduce operation speed and/or increase power consumption thereof.

SUMMARY

According to example embodiments of the inventive concepts, a nonvolatile memory device may include a memory cell array including a plurality of cell strings arranged in rows and columns, each of the plurality of cell strings including a ground selection transistor among a plurality of ground selection transistors, one or more memory cells among a plurality of memory cells, and a string selection transistor among a plurality of string selection transistors, and row decoder circuitry connected to, the plurality of ground selection transistors through a plurality of ground selection lines, the plurality of memory cells through a plurality of word lines, and the plurality of string selection transistors through a plurality of string selection lines. The row decoder circuitry may be configured to control voltages supplied to the memory cell array during a read operation of reading data from selected memory cells among the plurality of memory cells, by applying a turn on voltage to a first ground selection line selected from the plurality of ground selection lines, applying a turn off voltage to at least one second ground selection line selected from the plurality of ground selection lines, the at least one second ground selection line being selected from the plurality of ground selection lines based on a read address associated with the read operation, and applying the turn off voltage to an unselected ground selection line among the plurality of ground selection lines after applying a prepulse voltage to the unselected ground selection line.

According to example embodiments of the inventive concepts, a storage device may include a nonvolatile memory device including a plurality of memory blocks, each memory block including a plurality of memory cells and a plurality of selection transistors, and a controller configured to transmit to the nonvolatile memory device a read command and a read address, the read address identifying a selected memory block among the plurality of memory blocks and one or more selected memory cells among the plurality of memory cells of the selected memory block. The nonvolatile memory device may include processing circuitry configured to control voltages supplied to the plurality of memory blocks in response to the read command in a first mode, by applying a turn on voltage to a plurality of first selection transistors associated with the read address among the plurality of selection transistors, applying a turn off voltage to a plurality of second selection transistors among the plurality of selection transistors, the plurality of second selection transistors being selected based on the read address, and applying the turn off voltage to a plurality of third selection transistors among the plurality of selection transistors, the plurality of third selection transistors being selected based on the read address after applying a prepulse voltage to the plurality of third selection transistors.

According to example embodiments of the inventive concepts, an operating method of a nonvolatile memory device including a plurality of memory cells and a plurality of selection transistors may include receiving a read command and a read address indicating one or more selected memory cells among the plurality of memory cells, and performing a read operation in response to the read command including applying a turn on voltage to a plurality of first selection transistors associated with the read address among the plurality of selection transistors, applying a turn off voltage to a plurality of second selection transistors among the plurality of selection transistors, the plurality of second selection transistors being selected based on with the read address, and applying the turn off voltage to a plurality of third selection transistors among the plurality of selection transistors, the plurality of third selection transistors being selected based on the read address after applying a prepulse voltage to the plurality of third selection transistors.

DETAILED DESCRIPTION

Figure 1:
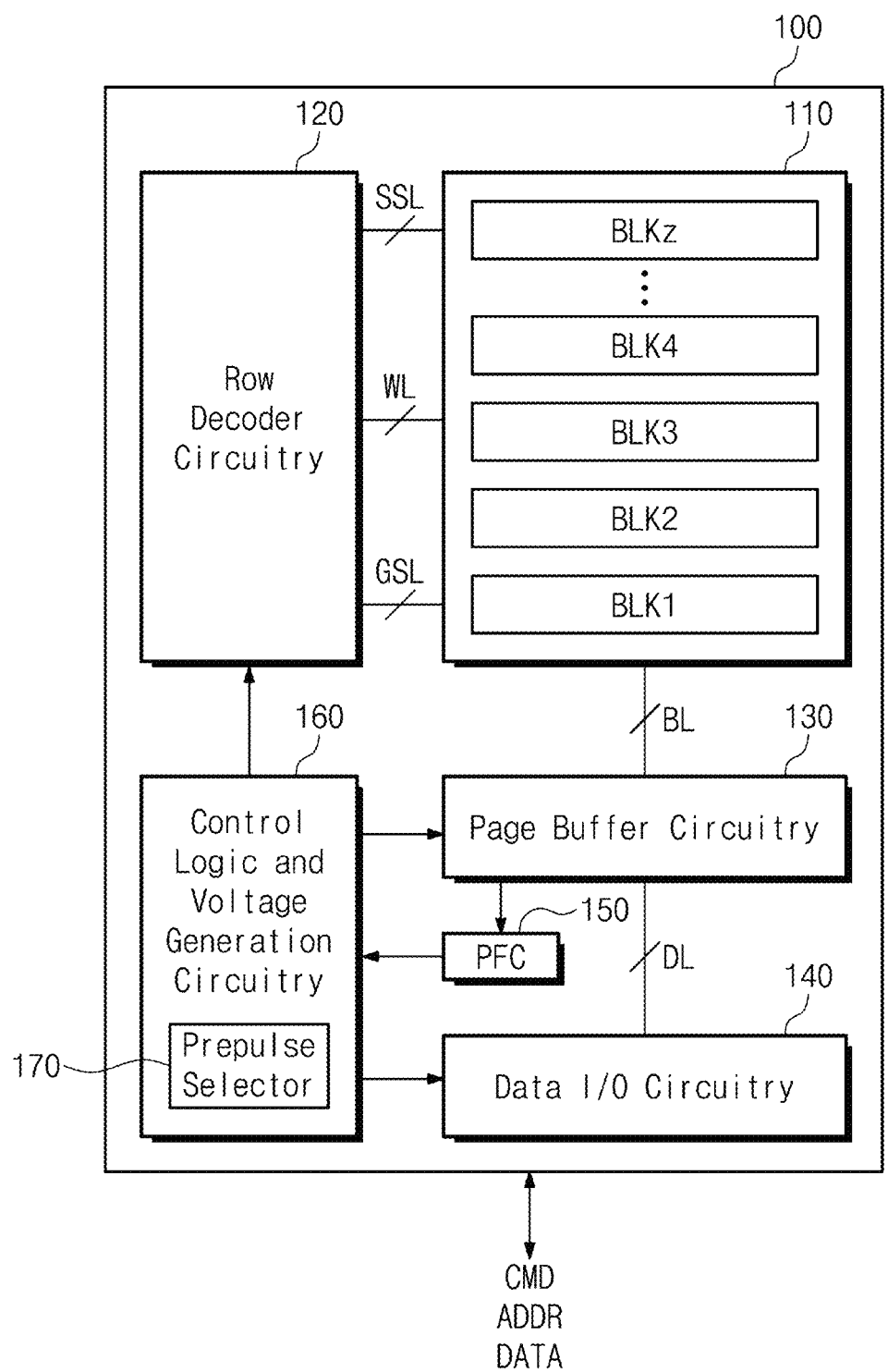
FIG. 1 is a block diagram of a nonvolatile memory device according to example embodiments of the inventive concepts.

Various example embodiments will now be described more fully hereinafter with reference to the accompanying drawings. Like reference numerals may refer to like elements throughout this application.

FIG. 1 is a block diagram of a nonvolatile memory device according to example embodiments of the inventive concepts.

Referring to FIG. 1, a nonvolatile memory device 100 may include a memory cell array 110, row decoder circuitry 120 (may also be referred to as a row decoder and/or a row decoder block), page buffer circuitry 130 (may also be referred to as a page buffer and/or a page buffer block), data input/output (I/O) circuitry 140 (may also be referred to as an input/output block), pass/fail check circuitry 150 (may also be referred to as a pass/fail check block), and/or control logic and voltage generation circuitry 160 (may also be referred to as a control logic and voltage generation block).

The memory cell array 110 may include a plurality of memory blocks BLK1~BLKz (e.g., BLK1, BLK2, BLK3, BLK4 . . . BLKz). Each of the plurality of memory blocks BLK1~BLKz may include a plurality of memory cells. Each of the plurality of memory blocks BLK1~BLKz may be connected to the row decoder block 120 through ground selection lines GSL, word lines WL, and/or string selection lines SSL.

Each of the plurality of memory blocks BLK1~BLKz may be connected to the page buffer block 130 through a plurality of bit lines BL. The plurality of memory blocks BLK1~BLKz may commonly be connected to the plurality of bit lines BL. The memory cells of the plurality of memory blocks BLK1~BLKz may have the same structure or a similar structure.

As an example, each of the plurality of memory blocks BLK1~BLKz may be a unit of an erase operation. The memory cells of the memory cell array 110 may be erased in units of one memory block. The memory cells included in one memory block may be erased at the same time or contemporaneously. In other example, each of the plurality of memory blocks BLK1~BLKz may be divided into a plurality of sub blocks. Each of the plurality of sub blocks may be an unit of the erase operation.

In some embodiments, each of the plurality of memory blocks BLK1~BLKz may include a physical storage space identified by a block address. Each of the word lines WL may correspond to a physical storage space identified by a row address. Each of the bit lines BL may correspond to a physical storage space identified by a column address.

In some embodiments, each of the plurality of memory blocks BLK1~BLKz may include a plurality of physical pages. Each physical page may include a plurality of memory cells. Each physical page may be an unit of a program operation. The memory cells of each physical page may be programmed at the same time or contemporaneously. Each physical page may include a plurality of logical pages.

Bits programmed in each of the memory cells of each physical page may each form logical pages. First bits programmed in the memory cells of each physical page may form a first logical page. Kth bits (wherein k is a positive integer) programmed in the memory cells of each physical page may form a kth logical page.

The row decoder block 120 may be connected to the memory cell array 110 through a plurality of word lines WL and/or a plurality of string selection lines SSL. The row decoder block 120 may operate according to control of the control logic and voltage generation block 160.

The row decoder block 120 may decode a row address of an address ADDR received from a controller 220 (refer to FIG. 15) thorough a first channel (e.g., an input and/or output channel) and may control voltages applied to the string selection lines SSL, the word lines WL, and/or the ground selection lines GSL according to the decoded address.

The page buffer block 130 may be connected to the memory cell array 110 through the plurality of bit lines BL.

The page buffer block 130 may be connected to the data input/output block 140 through a plurality of data lines DL. The page buffer block 130 may operate according to the control of the control logic and voltage generation block 160.

The page buffer block 130 may decode a column address of the address ADDR and may exchange data with the data input/output block 140 based on the column address. For example, the page buffer block 130 may output data corresponding to the column address among the data stored therein to the data input/output block 140. The page buffer block 130 may store data transmitted from the data input/output block 140 in a location corresponding to the column address.

The data input/output block 140 may be connected to the page buffer block 130 through the plurality of data lines DL. The data input/output block 140 may output data DATA read by the page buffer block 130 to an external device (e.g., the controller 220 (refer to FIG. 15)) through the first channel (e.g., input and/or output channel) and/or may transmit the data DATA received from the controller 220 through the first channel, to the page buffer block 130.

The pass/fail check block (PFC) 150 may receive a sensing result from the page buffer block 130 after a verify read of a write operation is performed. Based on the received sensing result, the pass/fail check block 150 may determine a pass or fail result of the write operation.

For example, the page buffer block 130 may count the number of on-cells turned on during the verify read of the write operation. If the number of on-cells is equal to or greater than a threshold value, the pass/fail check block 150 may determine the fail. If the number of on-cells is less than a threshold value (e.g., the threshold value), the pass/fail check block 150 may determine the pass. According to some example embodiments, the threshold value may be a parameter determined depending on the number of error bits correctable by an error correction code, determined depending through empirical study, or determined by a request from a manufacturer who makes various products using the nonvolatile memory device 100.

Figure 15:
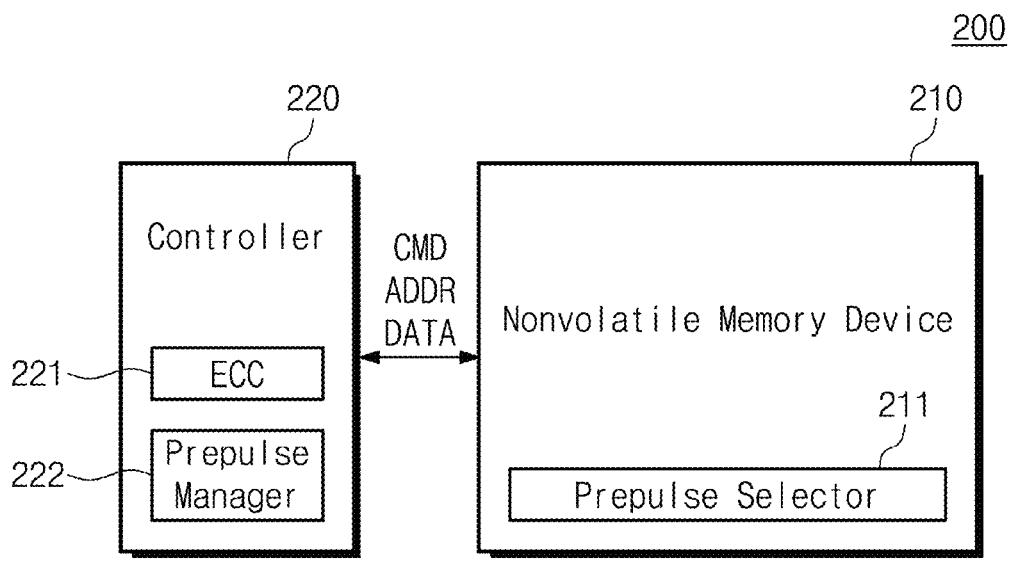
FIG. 15 is a block diagram of a storage device according to example embodiments of the inventive concepts.

The control logic and voltage generation block 160 may receive a command CMD through the first channel and control signals through a second channel (e.g., control channel), from the controller 220 (refer to FIG. 15). The control logic and voltage generation block 160 may receive the command CMD received through the first channel in response to the control signals, may route the address ADDR received through the first channel to the row decoder block 120 and the page buffer block 130, and/or may route the data DATA received through the first channel to the data input/output block 140.

The control logic and voltage generation block 160 may be configured to generate various voltages for application to the memory cell array 110 during the read operation, the write operation, and/or the erase operation. The control logic and voltage generation block 160 may decode the received command CMD and may control the nonvolatile memory device 100 according to the decoded command CMD. During the verify read of the write operation, the control logic and voltage generation block 160 may receive a determination result of pass or fail from the pass/fail check block 150.

The control logic and voltage generation block 160 may include a prepulse selector 170. The prepulse selector 170 may be configured to select an object to which a prepulse voltage is to be applied during the read operation and/or the verify read. An operation of the prepulse selector 170 will be described in detail with reference to FIGS. 7 to 9. According to some example embodiments, operations described herein as being performed by any or all of the nonvolatile memory device 100, the row decoder circuitry 120, the page buffer circuitry 130, the data input/output (I/O) circuitry 140, the pass/fail check circuitry 150, the control logic and voltage generation circuitry 160 and the prepulse selector 170 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 2:
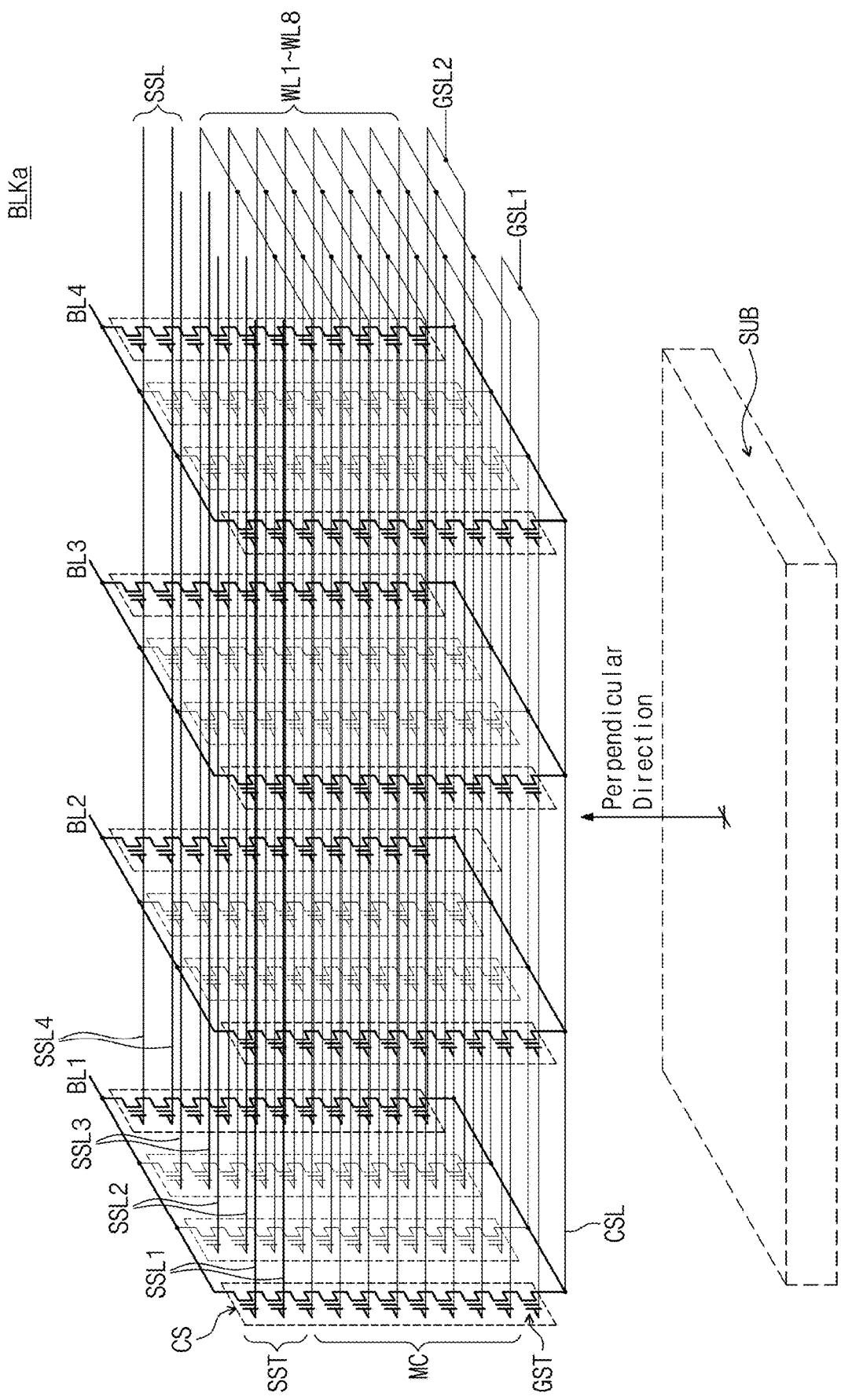
FIG. 2 is a circuit diagram illustrating one of memory blocks of FIG. 1 according to example embodiments of the inventive concepts.

FIG. 2 is a circuit diagram illustrating one of memory blocks of FIG. 1 according to example embodiments of the inventive concepts.

Referring to FIGS. 1 and 2, in one memory block BLKa of the memory blocks BLK1~BLKz, a plurality of cell strings CS may be arranged on a substrate SUB in rows and columns. The cell strings CS may be commonly connected to a common source line CSL on or in the substrate SUB. To help understand a structure of the memory block BLKa, a location of the substrate SUB is exemplarily illustrated.

Referring to FIG. 2, the common source line CSL may be connected to lower ends of the cell strings CS. However, it is sufficient for the common source line CSL to be electrically connected to the lower ends of the cell strings CS and the common source line CSL is not limited to being physically located below the low ends of the cell strings CS. As an example, the cell strings CS may be arranged in 4×4 arrays, In some embodiments, the memory block BLKa may include a number of the cell strings CS that are more or less than those arranged in 4×4 arrays.

The cell strings CS of each row may be commonly connected to the ground selection line GSL1 or GSL2. For example, the cell strings CS of first and second rows may be commonly connected to the first ground selection line GSL1, and the cell strings CS of third and fourth rows may be commonly connected to the second ground selection line GSL2.

The cell strings CS of each row may be connected to corresponding ones of first to fourth string selection lines SSL1~SSL4. The cell strings CS of each column may be connected to a corresponding one of first to fourth bit lines BL1~BL4 (e.g., BL1, BL2, BL3 and BL4). To reduce complication of the drawings, the cell strings CS connected to second and third string selection lines SSL2 and SSL3 are illustrated using lighter lines.

Each cell string CS may include at least one ground selection transistor GST connected to the ground selection line GSL1 or GSL2, a plurality of memory cells MC1~MC8 (e.g., MC) connected to a plurality of word lines WL1~WL8, respectively, and string selection transistors SST connected to the string selection lines SSL1, SSL2, SSL3 and/or SSL4.

In each cell string CS, the ground selection transistor GST, memory cells MC1~MC8, and string selection transistors SST may be connected in series along a direction perpendicular to the substrate SUB and may be sequentially stacked along the perpendicular direction. In each cell string CS, at least one of the memory cells MC1~MC8 may be used as a dummy memory cell. The dummy memory cell may not be programmed (e.g., may be prohibited from being programmed) or may be programmed differently from others of the memory cells MC1~MC8.

In some embodiments, the memory cells of the cell strings CS of each row located at the same level may form one physical page. The memory cells of the one physical page may be connected to one sub word line. The sub word lines of physical pages located at the same level may be commonly connected to one word line (one of WL1~WL8).

In some embodiments, the sub word lines of the physical pages located at the same level may be connected to each other at the same level. In some embodiments, the sub word lines of the physical pages located at the same level may be indirectly connected to each other through another layer, such as a metal line, located at a different level from the sub word lines.

Figure 3:
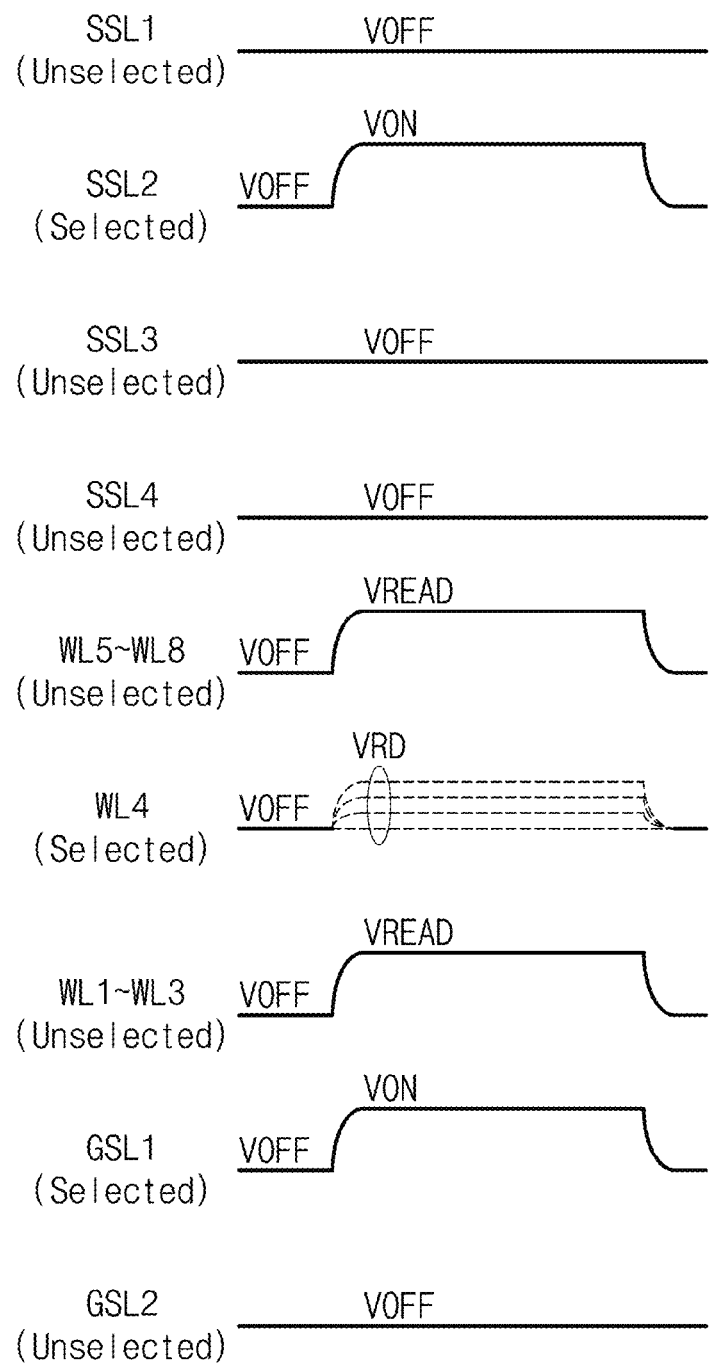
FIG. 3 is a block diagram illustrating an example of voltages applied to the memory block of FIG. 2 during a read operation according to example embodiments of the inventive concepts.

FIG. 3 is a block diagram illustrating an example of voltages applied to the memory block of FIG. 2 during a read operation according to example embodiments of the inventive concepts.

Referring to FIGS. 1 to 3, in the memory block BLKa, a fourth word line WL4 and the second string selection line SSL2 may be selected. In other words, the memory cells commonly corresponding to the fourth word line WL4 and the second string selection line SSL2 may be selected as objects (e.g., memory cells) subject to the read operation.

The row decoder block 120 may maintain voltages of the unselected first string selection line SSL1 at an OFF voltage VOFF. The OFF voltage VOFF may turn off the string selection transistors SST connected to the first string selection line SSL1. For example, a level of the OFF voltage VOFF applied to the string selection transistors SST adjacent to a second bit line BL2 may be different from a level of the OFF voltage VOFF applied to the string selection transistor SST adjacent to an eighth memory cell MC8.

The row decoder block 120 may apply an ON voltage VON to the selected second string selection line SSL2. The ON voltage VON may turn on the string selection transistors SST connected to the second string selection line SSL2. For example, a level of the ON voltage VON applied to the string selection transistors SST adjacent to the second bit line BL2 may be different from a level of the ON voltage VON applied to the string selection transistor SST adjacent to the eighth memory cell MC8.

Similar to the first string selection line SSL1, the row decoder block 120 may maintain the voltages of the third string selection lines SSL3 and the fourth string selection lines SSL4 that are unselected at the OFF voltage. The levels of the OFF voltage applied to the first string selection lines SSL1, the third string selection lines SSL3, and the fourth string selection lines SSL4 that are unselected may be the same or different.

The row decoder block 120 may apply a read pass voltage VREAD to first to third word lines WL1~WL3 and fifth to eighth word lines WL5~WL8 that are unselected. The read pass voltage VREAD may be a voltage higher than threshold voltages of first to third memory cells MC1~MC3 and fifth to eighth memory cells MC5~MC8. Levels of the read pass voltage VREAD applied to the first to third word lines WL1~WL3 and the fifth to eighth word lines WL5~WL8 that are unselected may be the same or different.

The row decoder block 120 may apply a read voltage VRD to the fourth word line WL4. The read voltage VRD may have one of various levels depending on an object subject to be read as marked by dotted lines. The row decoder block 120 may apply the ON voltage VON to the selected first ground selection line GSL1. A level of the ON voltage VON applied to the first ground selection line GSL1 may be equal to or different from the level of the ON voltage VON applied to the second string selection lines SSL2.

The row decoder block 120 may maintain a voltage of the second ground selection line GSL2 at the OFF voltage VOFF. A level of the OFF voltage VOFF applied to the second ground selection line GSL2 may be equal to or different from a level of the OFF voltage VOFF applied to the first, third and fourth string selection lines SSL1, SSL3, and SSL4.

Figure 4:
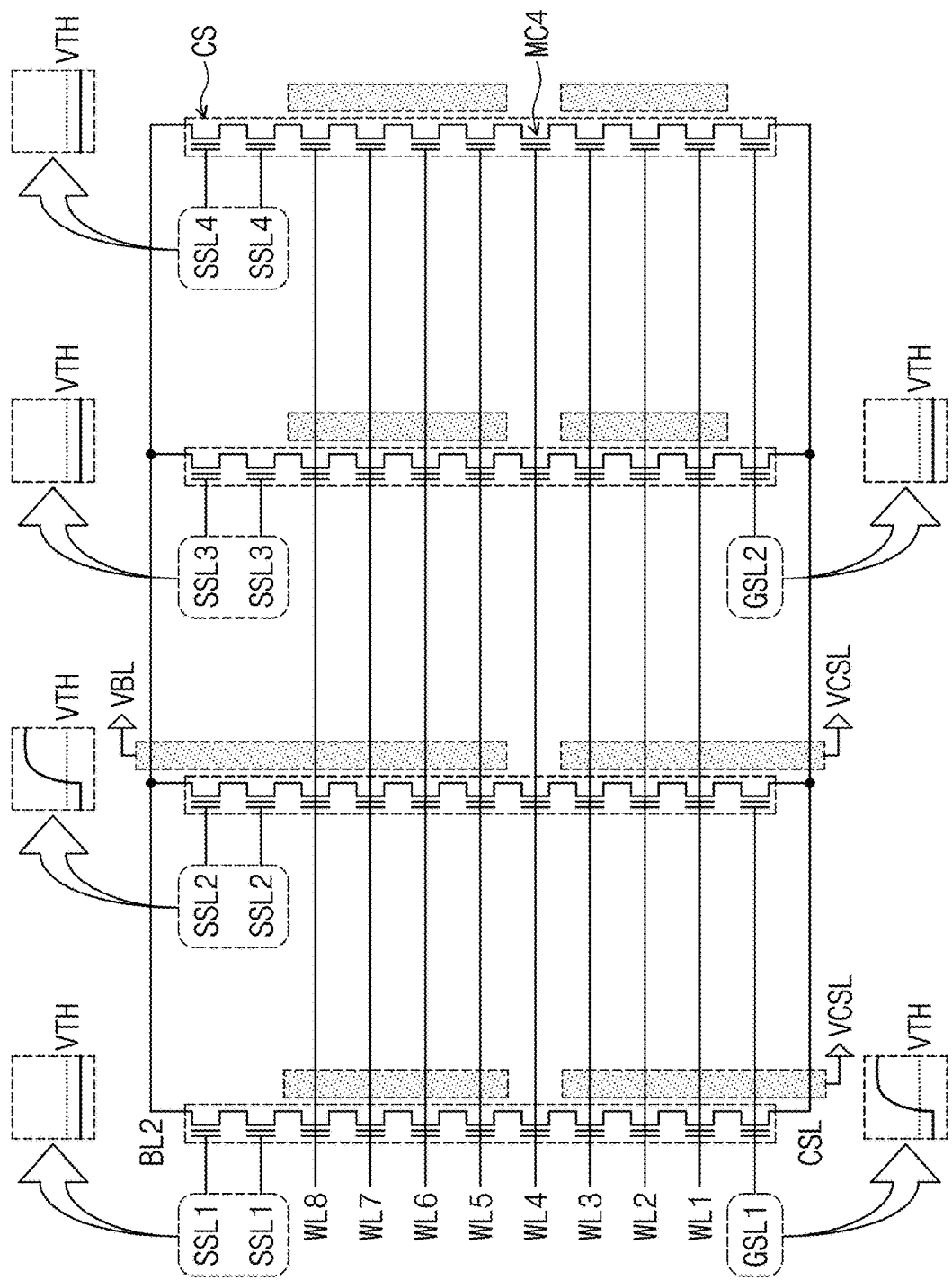
FIG. 4 illustrates an example in which the voltages of FIG. 3 are applied to cell strings of a second column of the memory block of FIG. 2 according to example embodiments of the inventive concepts.

FIG. 4 illustrates an example in which the voltages of FIG. 3 are applied to cell strings of a second column of the memory block of FIG. 2 according to example embodiments of the inventive concepts.

Referring to FIGS. 3 and 4, channels formed in the cell strings CS are illustrated in a rectangle filled with dots. For example, when the read voltage VRD is applied to the fourth word line WL4, it is assumed that fourth memory cells MC4 are turned-off.

In other words, the channels may not be formed in the fourth memory cells MC4, and the fourth memory cells MC4 may separate the channels. Hereinafter, the channels over the fourth memory cells MC4 (e.g., channels formed adjacent to the string selection transistors SST) may refer to upper channels, and the channels below the fourth memory cells MC4 (e.g., channels formed adjacent to the ground selection transistors GST) may refer to lower channels.

As the read pass voltage VREAD is applied to the fifth to eighth word lines WL5~WL8, the fifth to eighth memory cells MC5~MC8 may be turned-on and the channel may be formed. As the OFF voltage VOFF is applied to the first, third, and fourth string selection lines SSL1, SSL3, and SSL4, the channels may not be formed in the string selection transistors SST connected to the first, third, and fourth string selection lines SSL1, SSL3, and SSL4. Therefore, the upper channels corresponding to third, and fourth string selection lines SSL1, SSL3, and SSL4 may be separated from the second bit line BL2.

As the ON voltage VON is applied to the second string selection lines SSL2, the channels may be formed in the string selection transistors SST connected to the second string selection line SSL2. The upper channels corresponding to the second string selection line SSL2 may be connected to the second bit lines BL2 and may be supplied with a bit line voltage VBL from the second bit line BL2.

As the read pass voltage VREAD is applied to the first to third word lines WL1~WL3, the first to third memory cells MC1~MC3 may be turned-on and the channels may be formed. As the OFF voltage VOFF is applied to the second ground selection line GSL2, the channels may not be formed in the ground selection transistors GST connected to the second ground selection line GSL2. Therefore, the lower channels corresponding to the second ground selection line GSL2 may be separated from the common source line CSL.

As the ON voltage VON is applied to the first ground selection line GSL1, the channels may be formed in the ground selection transistors GST connected to the first ground selection line GSL1. Therefore, the lower channels corresponding to the first ground selection line GSL1 may be connected to the common source line CSL and may be supplied with a common source line voltage VCSL from the common source line CSL.

Referring to FIG. 4, the upper channel corresponding to the first string selection lines SSL1 may be in a floating state and a voltage of the lower channel may be maintained at the common source line voltage VCSL. The voltage of the upper channel may be boosted by coupling as the read pass voltage VREAD is applied.

Due to a difference in voltages of the upper channel and the lower channel, a hot carrier injection (HCI) may be caused in the fourth memory cells MC4. The hot carrier injection may lead to change in threshold voltages of adjacent memory cells, thus causing data degradation.

Likewise, all the upper channel and the lower channel corresponding to the third and fourth string selection lines SSL3 and SSL4 may be floated. The voltages of the upper channel and the lower channel may be boosted by the read pass voltage VREAD. The voltage of the upper channel and the voltage of the lower channel may vary according to an environment where the boosting occurs, and the voltages of the upper channel and the lower channel may also cause degradation of data based on the hot carrier injection.

As describe above, when the read operation is performed, the reliability of the stored data may be degraded due to the hot carrier injection. This phenomenon may also occur when the verify read is performed during the write operation. For example, the verify read may be performed in the same manner or a similar manner as described with reference to FIGS. 3 and 4 by substituting the read voltage VRD for a verify voltage, and thus the degradation of data may occur during the verify read.

Figure 5:
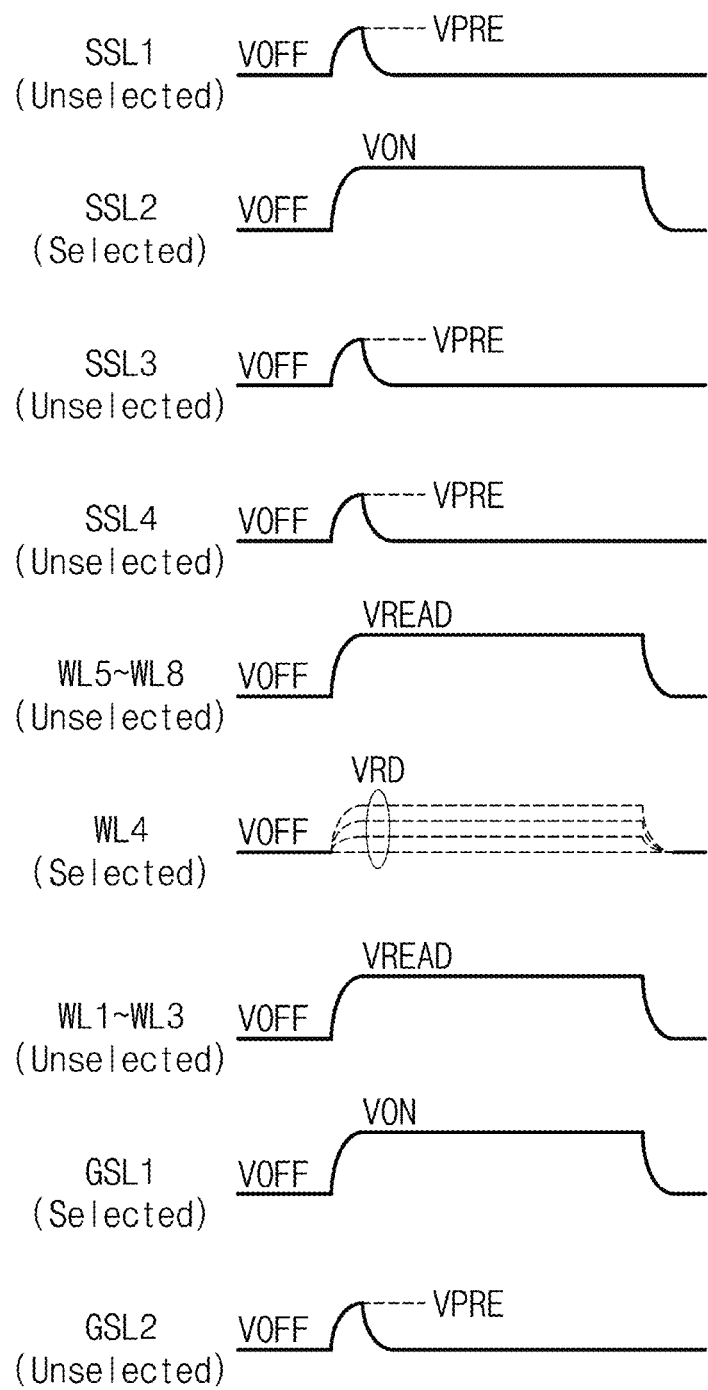
FIG. 5 illustrates an example of voltages applied to the memory block of FIG. 2 during a read operation according to example embodiments of the inventive concepts.

FIG. 5 illustrates an example of voltages applied to the memory block of FIG. 2 during a read operation according to example embodiments of the inventive concepts.

Referring to FIG. 5, it is assumed that the second string selection line SSL2 and the fourth word line WL4 are selected by the address ADDR, as described with reference to FIG. 3.

In contrast to the example of FIG. 3, the row decoder block 120 may apply the OFF voltage VOFF to the first, third, and fourth string selection lines SSL1, SSL3, and SSL4 that are unselected after applying a prepulse voltage VPRE to the unselected first, third, and fourth string selection lines SSL1, SSL3, and SSL4. The row decoder block 120 may also apply the OFF voltage VOFF to the unselected second ground selection line GSL2 after applying the prepulse voltage VPRE to the unselected ground selection line GSL2.

The prepulse voltage VPRE may start to be applied simultaneously or contemporaneously with the read pass voltage VREAD. The prepulse voltage VPRE may turn on the string selection transistors SST and the ground selection transistors GST. The prepulse voltage VPRE may be lower than the read pass voltage VREAD.

While applying the read pass voltage VREAD to the first to third and fifth to eighth word lines WL1~WL3 and WL5~WL8, the row decoder block 120 may apply the prepulse voltage VPRE to the unselected first, third, and fourth string selection lines SSL1, SSL3, and SSL4 and the unselected ground selection line GSL2 and then may apply the OFF voltage VOFF thereto. Levels of the prepulse voltage VPRE may vary depending on locations and kinds (e.g., types of lines) in which the prepulse voltage is applied.

Figure 6:
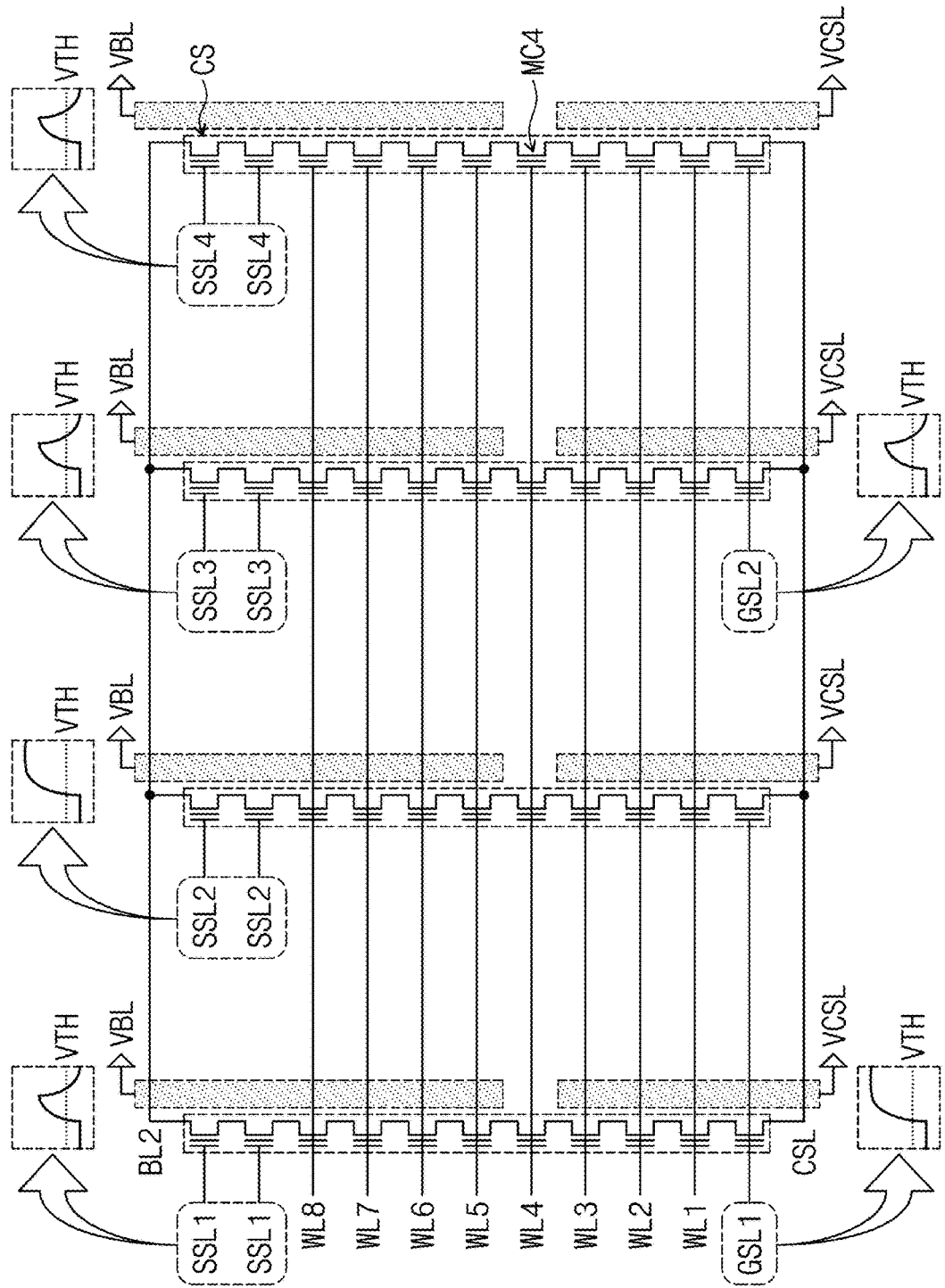
FIG. 6 illustrates an example in which the voltages of FIG. 5 are applied to cell strings of a second column of the memory block of FIG. 2 according to example embodiments of the inventive concepts.

FIG. 6 illustrates an example in which the voltages of FIG. 5 are applied to cell strings of a second column of the memory block of FIG. 2 according to example embodiments of the inventive concepts.

Referring to FIGS. 5 and 6, channels formed in the cell strings CS are illustrated in a rectangle filled with dots. For example, when the read voltage VRD is applied to the fourth word line WL4, it is assumed that the fourth memory cells MC4 are turned-off.

In FIG. 6, an example of timings of voltages applied to the first to fourth string selection lines SSL1~SSL4 and the first and second ground selection lines GSL1 and GSL2 is illustrated compared to threshold voltages VTH of the string selection transistors SST and the ground selection transistors GST.

While the prepulse voltage VPRE is applied to the unselected first, third, and fourth string selection lines SSL1, SSL3, and SSL4, the string selection transistors connected to the unselected first, third, and fourth string selection lines SSL1, SSL3, and SSL4 may be turned on. The voltages of the upper channels corresponding to the unselected first, third, and fourth string selection lines SSL1, SSL3, and SSL4 may be initialized to the bit line voltage VBL.

When the OFF voltage VOFF is applied to the unselected first, third, and fourth string selection lines SSL1, SSL3, and SSL4, the upper channels corresponding to the string selection transistors SST connected to the unselected first, third, and fourth string selection lines SSL1, SSL3, and SSL4 may be boosted by the read pass voltage VREAD.

Likewise, while the prepulse voltage VPRE is applied to the unselected second ground voltage GSL2, the ground selection transistors GST connected to the second ground selection line GSL2 may be turned on. The voltages of the lower channels corresponding to the unselected second ground selection line GSL2 may be initialized to the common source line voltage VCSL.

When the OFF voltage VOFF is applied to the unselected second ground selection line GSL2, the ground selection transistors GST connected to the unselected second ground selection line GSL2 may be turned off. Thereafter, the voltages of the lower channels corresponding to the unselected second ground selection line GSL2 may be boosted by the read pass voltage VREAD.

In contrast to the example of FIG. 4, the voltages of the upper channels and the lower channels shown in FIG. 6 may be initialized by the bit line voltage VBL and the common source line voltage VCSL, respectively. Thus, by adjusting the bit line voltage VBL and the common source line voltage VCSL, the voltage to which the upper channels are boosted and the voltage to which the lower channels are boosted may be similarly adjusted. In other words, the degradation of data by the hot carrier injection may be prevented and/or reduced.

While the prepulse voltage VPRE is applied, the voltages of the upper channels and the voltages of the lower channels may be maintained at the bit line voltage VBL and the common source line voltage VCSL, respectively. Thus, the upper channels and the lower channels may be applied to the first to eighth word lines WL1~WL8 as parasitic capacitors.

As the upper channels and the lower channels act as parasitic capacitors, a time when the voltages of the first to eighth word lines WL1~WL8 reach target levels of the read pass voltage VREAD may be delayed and the power consumption may increase. In the example of FIGS. 5 and 6, although the reliability of data is secured, a speed of the read operation may be reduced and/or the power consumption may increase.

Figure 7:
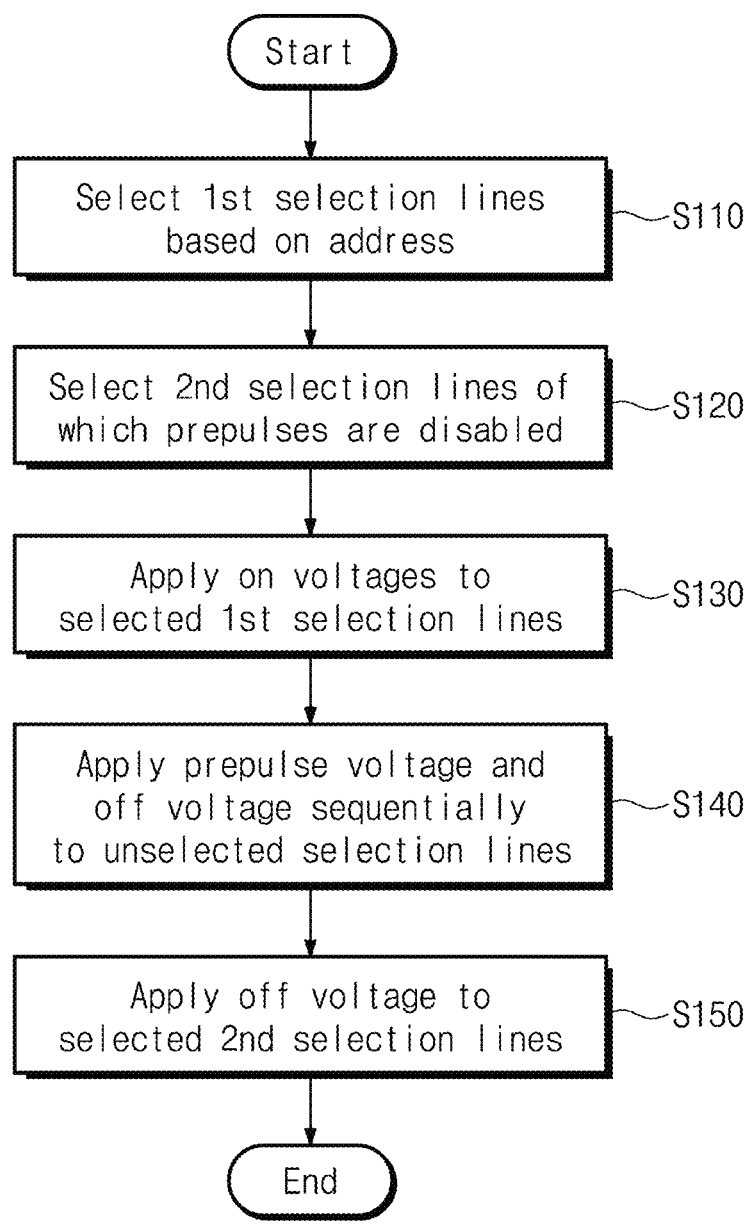
FIG. 7 illustrates an operating method of a nonvolatile memory device according to example embodiments of the inventive concepts.

FIG. 7 illustrates an operating method of a nonvolatile memory device 100 according to example embodiments of the inventive concepts.

Referring to FIGS. 1, 2, and 7, in operation S110, the row decoder block 120 may select first selection lines (e.g., string selection lines and ground selection lines) based on the address ADDR (e.g., a read address). The first selection lines may be related to the memory cells that are the objects subject to the read operation.

In operation S120, the prepulse selector 170 may select second selection lines (e.g., string selection line and ground selection line) in which the prepulse is to be disabled. The prepulse selector 170 may receive the address ADDR. The prepulse selector 170 may select the second selection lines among the selection lines except for the first selection lines based on the address ADDR.

In operation S130, the row decoder block 120 may apply the ON voltage VON to the selected first selection lines. In operation S140, the row decoder block 120 may apply sequentially the prepulse voltage VPRE and the OFF voltage VOFF to the unselected selection lines, for example, remaining selection lines in the memory block except for the selected first selection lines and the selected second selection lines (e.g., a set of selection lines exclusive of the first selection lines and the second selection lines).

In operation S150, the row decoder block 120 may apply the OFF voltage VOFF to the selected second selection lines. In other words, the nonvolatile memory device 100 may assign the selection lines (e.g., unselected selection lines), to which the prepulse voltage VPRE is applied and the selection lines (e.g., the selected second selection lines) to which the prepulse voltage VPRE is not applied, among the remaining selection lines except for the selection lines (e.g., the selected first selection lines) selected by the address ADDR, in the memory block selected by the address ADDR.

As the prepulse voltage VPRE is not applied to some of the selection lines unselected by the address ADDR, the parasitic capacitance applied to the first to eighth word lines WL1~WL8 may be reduced, such that the operation speed may be increased and/or the power consumption may be reduced.

The prepulse selector 170 may select different selection lines as the second selection lines when the read operation is performed. Locations of the second selection lines to which the prepulse voltage VPRE is not applied may be dynamically changed. Thus, the degradation of data that occurs because the prepulse voltage VPRE is not applied may be distributed across the cell strings in the memory block BLKa and the reliability may be improved.

Figure 8:
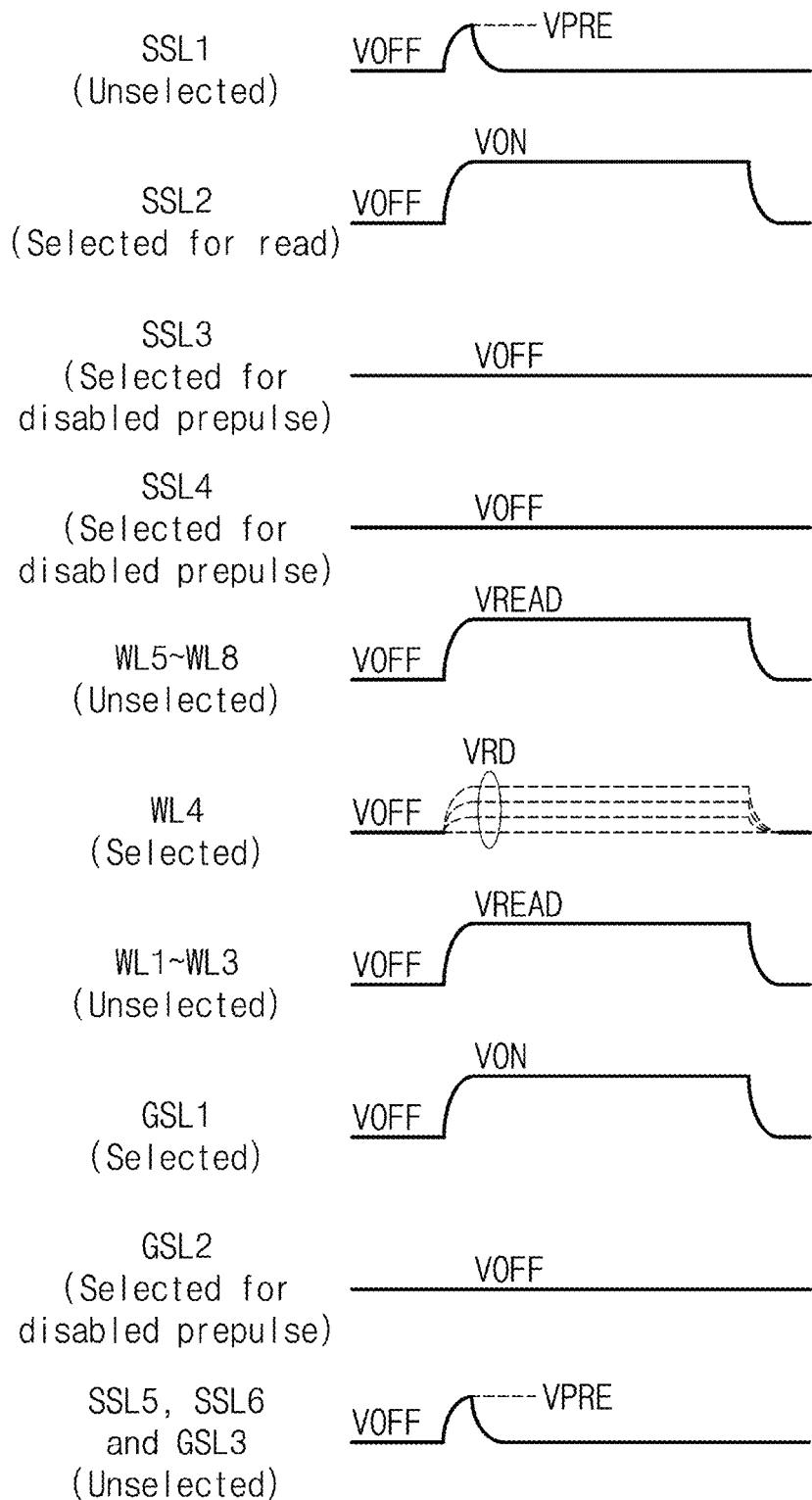
FIG. 8 illustrates an example of voltages applied to the memory block of FIG. 2 according to the operating method of FIG. 7 during a read operation according to example embodiments of the inventive concepts.

FIG. 8 illustrates an example of voltages applied to the memory block of FIG. 2 according to the operating method of FIG. 7 during a read operation according to example embodiments of the inventive concepts. As described with reference to FIG. 5, it is assumed that the second string selection line SSL2 and the fourth word line WL4 are selected by the address ADDR.

Referring to FIGS. 1, 2, and 8, in the structure of FIG. 2 in which the cell strings CS of two rows are connected to one ground selection line GSL1 or GSL2, for example, the selection of the second selection lines may be performed in units of the ground selection line. For example, when the first ground selection line GSL1 is selected by the address ADDR, another ground selection line (e.g., the second ground selection line GSL2) may be selected as an object to which the prepulse voltage VPRE is not applied.

Although four rows of the cell strings CS are shown in FIG. 2, the number of rows of the cell strings CS included in one memory block BLKa is not limited thereto. For example, three or more ground selection lines may be located in one memory block. One ground selection line may be selected as an object to be read by the address ADDR. At least one ground selection line may be selected as an object to which the prepulse voltage VPRE is not applied, by the prepulse selector 170. The prepulse voltage VPRE may be applied to at least one ground selection line.

Compared to the example of FIG. 5, the row decoder block 120 may share the cells strings CS with the first ground selection line GSL1 selected by the address ADDR and may apply the OFF voltage VOFF to the first string selection lines SSL1 unselected by the address ADDR after applying the prepulse voltage VPRE to the unselected first string selection lines SSL1.

The row decoder block 120 may supply the OFF voltage VOFF to the second ground selection line GSL2 selected by the prepulse selector 170. The row decoder block 120 may supply the OFF voltage VOFF to the third and fourth string selection lines SSL3 and SSL4 sharing the cell strings CS with the second ground selection line GSL2 selected by the prepulse selector 170.

Figure 9:
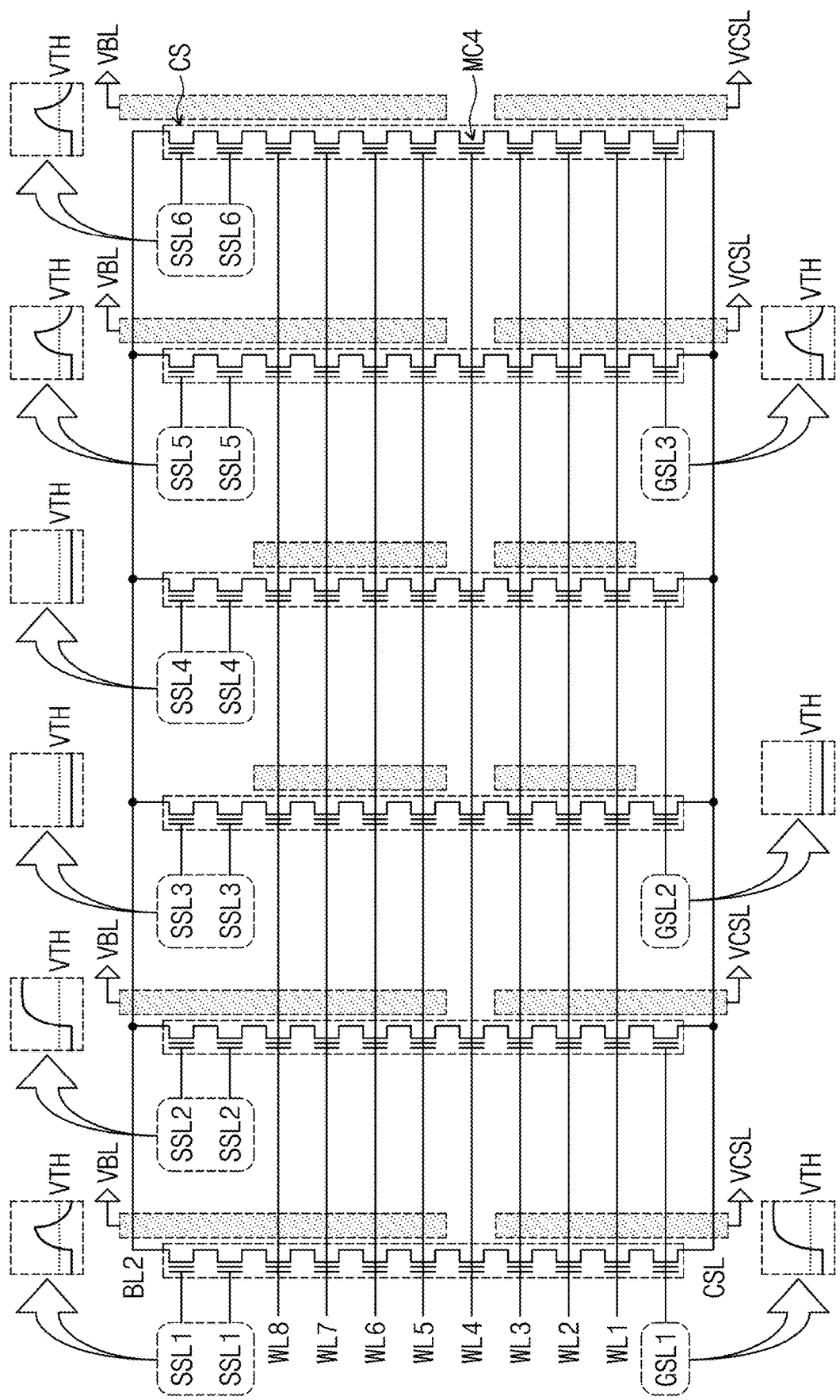
FIG. 9 illustrates an example in which the voltages of FIG. 8 are applied to cell strings of a second column of the memory block of FIG. 2 according to example embodiments of the inventive concepts.

In some embodiments, as shown in FIG. 9, it is assumed that an additional ground selection line GSL3 and string selection lines SSL5 and SSL6 sharing the cell strings CS with the additional ground selection line GSL3 are provided to the memory block BLKa. The additional ground selection line GSL3 may not be selected by the prepulse selector 170.

The row decoder block 120 may apply the OFF voltage VOFF to the additional ground selection line GSL3 after applying the prepulse voltage VPRE to the additional ground selection line GSL3. The row decoder block 120 may apply the prepulse voltage VPRE to the string selection lines SSL5 and SSL6 sharing the cell strings CS with the additional ground selection line GSL3 and then may apply the OFF voltage VOFF to the string selection lines SS5 and SS6.

FIG. 9 illustrates an example in which the voltages of FIG. 8 are applied to cell strings of a second column of the memory block of FIG. 2 according to example embodiments of the inventive concepts.

Referring to FIGS. 2, 8, and 9, the channels formed in the cell strings CS are illustrated in a rectangle filled with dots. For example, it is assumed that the fourth memory cells MC4 are turned off when the read voltage VRD is applied to the fourth word line WL4.

Compared to the example of FIG. 6, the memory block BLKa may further include the cell strings CS corresponding to the third ground selection line GSL3 and the fifth and sixth string selection lines SSL5 and SSL6. The upper and lower channels of the cell strings CS corresponding to the first ground selection line GSL1 selected by the address ADDR may be controlled as described with reference to FIG. 6. In other words, the voltages of the upper channels and the lower channels corresponding to the first ground selection lines GSL1 may be boosted after being initialized to the bit line voltage VBL and the common source line voltage VCSL, respectively. Thus, the degradation of data due to the hot carrier injection may be prevented and/or reduced.

The cell strings CS corresponding to the second ground selection line GSL2 unselected by the address ADDR and selected by the prepulse selector 170 may be controlled as described with reference to FIG. 4. In other words, the voltages of the upper channels and the lower channels corresponding to the second ground selection line GSL2 may be boosted in a floating state. Therefore, a capacitance of the parasitic capacitor applied to the first to eighth word lines WL1~WL8 may be reduced compared to the example of FIG. 6.

The cell strings CS corresponding to the third ground selection line GSL3 unselected by the address ADDR and the prepulse selector 170 may be controlled as described with reference to FIG. 4. In other words, the voltages of the upper channels and the lower channels corresponding to the third ground selection lines GSL3 may be boosted after being initialized to the bit line voltage VBL and the common source line voltage VCSL. Thus, the degradation of data due to the hot carrier injection may be prevented and/or reduced.

The nonvolatile memory device 100 according to example embodiments of the inventive concepts may prevent and/or reduce the degradation of data and may guarantee and/or improve data reliability, by applying the prepulse voltage VPRE to some of the selection lines unselected by the address ADDR. In addition, the nonvolatile memory device 100 may increase its operation speed and/or may reduce its power consumption, by not applying the prepulse voltage VPRE to the rest of the selection lines unselected by the address ADDR.

The nonvolatile memory device 100 may distribute the degradation of data across the cell strings CS by dynamically changing the locations of the cell strings CS to which the prepulse is applied (e.g., whenever the read operation is performed). Thus, concentration of the degradation of data may be prevented and/or reduced and the data reliability may be guaranteed and/or improved.

The nonvolatile memory device 100 may dynamically control the number of the selection lines to which the prepulse voltage VPRE either is or not applied. Thus, the nonvolatile memory device 100 may support tuning according to use in consideration of trade-offs between the reliability, the operating speed, and/or the power consumption.

Figure 10:
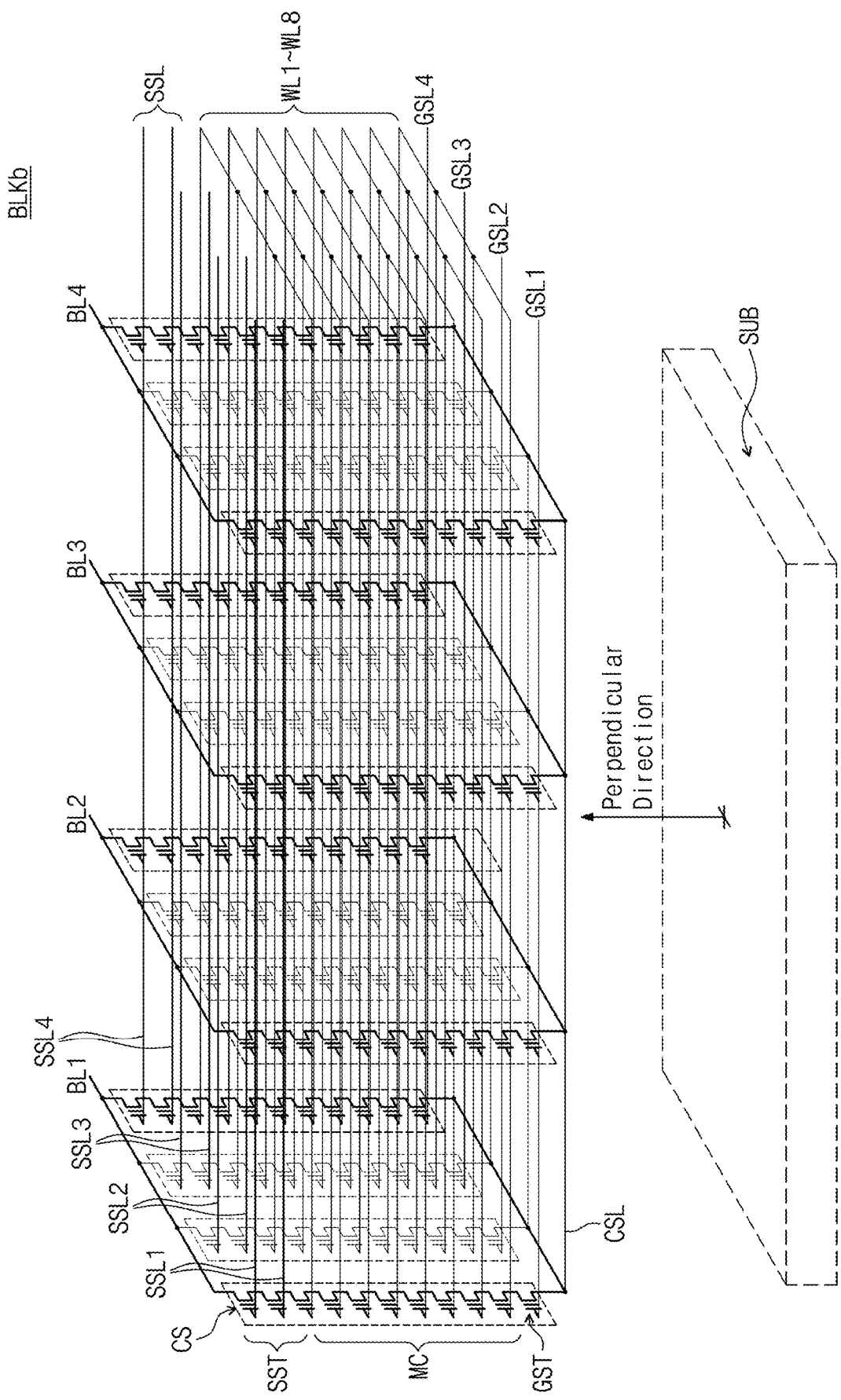
FIG. 10 illustrates one of memory blocks of FIG. 1 according to example embodiments of the inventive concepts.

FIG. 10 illustrates one of memory blocks of FIG. 1 according to example embodiments of the inventive concepts.

Referring to FIG. 10, compared to the memory block BLKa of FIG. 2, a memory block BLKb includes the rows of the cell strings CS connected to different ground selection lines. In other words, four rows of the cell strings CS may be respectively connected to different first to fourth ground selection lines GSL1~GSL4 (e.g., GSL1, GSL2, GSL3 and GSL4).

Figure 11:
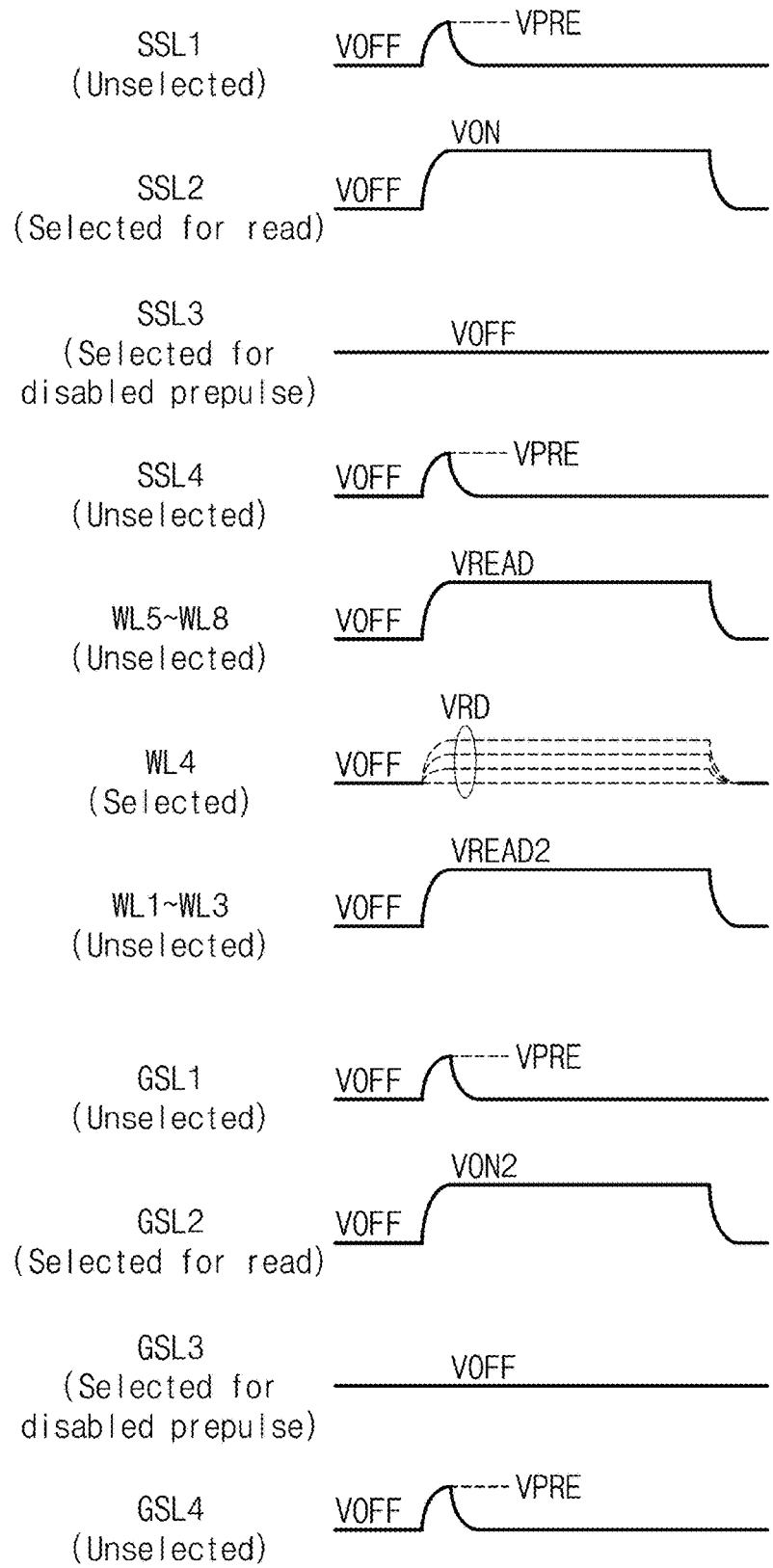
FIG. 11 illustrates an example of voltages applied to the memory block of FIG. 10 according to the operating method of FIG. 7 during a read operation according to example embodiments of the inventive concepts.

FIG. 11 illustrates an example of voltages applied to the memory block of FIG. 10 according to the operating method of FIG. 7 during a read operation according to example embodiments of the inventive concepts.

As described with reference to FIG. 8, it is assumed that the second string selection line SSL2 and the fourth word line WL4 are selected by the address ADDR.

Referring to FIGS. 1, 10, and 11, as an example, in the structure of FIG. 10 in which the cell strings CS of one row connected to one ground selection line, selection of the second selection lines may be performed in units of a ground selection line. For example, when the ground selection line GSL1 is selected by the address ADDR, another ground selection line, for example, the third ground selection line GSL3 may be selected as an object to which the prepulse voltage VPRE is not applied.

Compared to the example of FIG. 5, the row decoder block 120 may apply the ON voltage VON to the second ground selection line GSL2 and the second string selection lines SSL2 that are selected by the address ADDR. The row decoder block 120 may apply the OFF voltage VOFF to the third ground selection line GSL3 selected by the prepulse selector 170. The row decoder block 120 may supply the OFF voltage VOFF to the third string selection lines SSL3 sharing the cell strings CS with the third ground selection line GSL3.

The row decoder block 120 may apply the prepulse voltage VPRE to the first and fourth ground selection lines GSL1 and GSL4 unselected by the prepulse selector 170 and then may supply the OFF voltage VOFF to the unselected the first and fourth ground selection lines GSL1 and GSL4. The row decoder block 120 may apply the prepulse voltage VPRE to the first and fourth string selection lines SSL1 and SSL4 sharing the cell stings CS with the first and fourth ground selection lines GSL1 and GSL4 unselected by the prepulse selector 170 and may supply the OFF voltage VOFF thereto.

Figure 12:
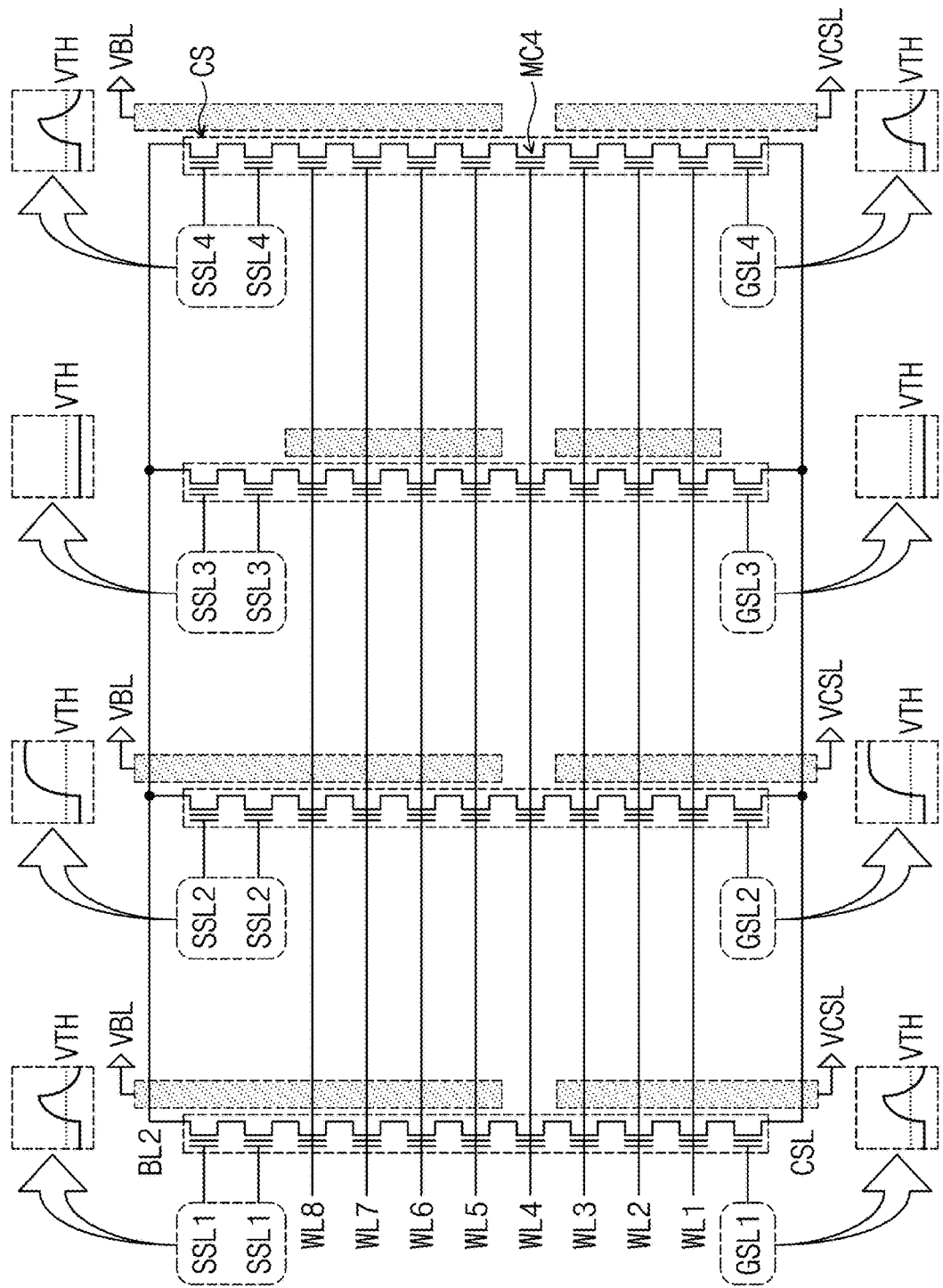
FIG. 12 illustrates an example in which the voltages of FIG. 11 are applied to cell strings of a second column of the memory block of FIG. 10 according to example embodiments of the inventive concepts.

FIG. 12 illustrates an example in which the voltages of FIG. 11 are applied to cell strings of a second column of the memory block of FIG. 10 according to example embodiments of the inventive concepts.

Referring to FIGS. 10, 11 and 12, the channel formed in the cell strings CS are illustrated in a rectangle filled with dots. For example, it is assumed that the fourth memory cells MC4 are turned off when the read voltage VRD is applied to the fourth word line WL4.

Compared to the example of FIG. 6, the upper and lower channels of the cell strings CS corresponding to the second ground selection line GSL2 selected by the address ADDR may be controlled as described with reference to FIG. 6. In other words, the voltages of the upper channels and the lower channels corresponding to the second ground selection lines GSL2 may be boosted after being initialized to the bit line voltage VBL and the common source line voltage VCSL. Thus, the degradation of data due to the hot carrier injection may be prevented and/or reduced.

The cell strings CS corresponding to the third ground selection line GSL3 unselected by the address ADDR and selected by the prepulse selector 170 may be controlled as described with reference to FIG. 4. In other words, the voltages of the upper channels and the lower channels corresponding to the third ground selection line GSL3 may be boosted in a floating state. Therefore, a capacitance of the parasitic capacitor applied to the first to eighth word lines WL1~WL8 may be reduced compared to the example of FIG. 6.

The cell strings CS corresponding to the first and fourth ground selection lines GSL1 and GSL4 unselected by the address ADDR and the prepulse selector 170 may be controlled as described with reference to FIG. 4. In other words, the voltages of the upper channels and the lower channels corresponding to the first and fourth ground selection lines GSL1 and GSL4 may be boosted after being initialized to the bit line voltage VBL and the common source line voltage VCSL. Thus, the degradation of data due to the hot carrier injection may be prevented and/or reduced.

Figure 13:
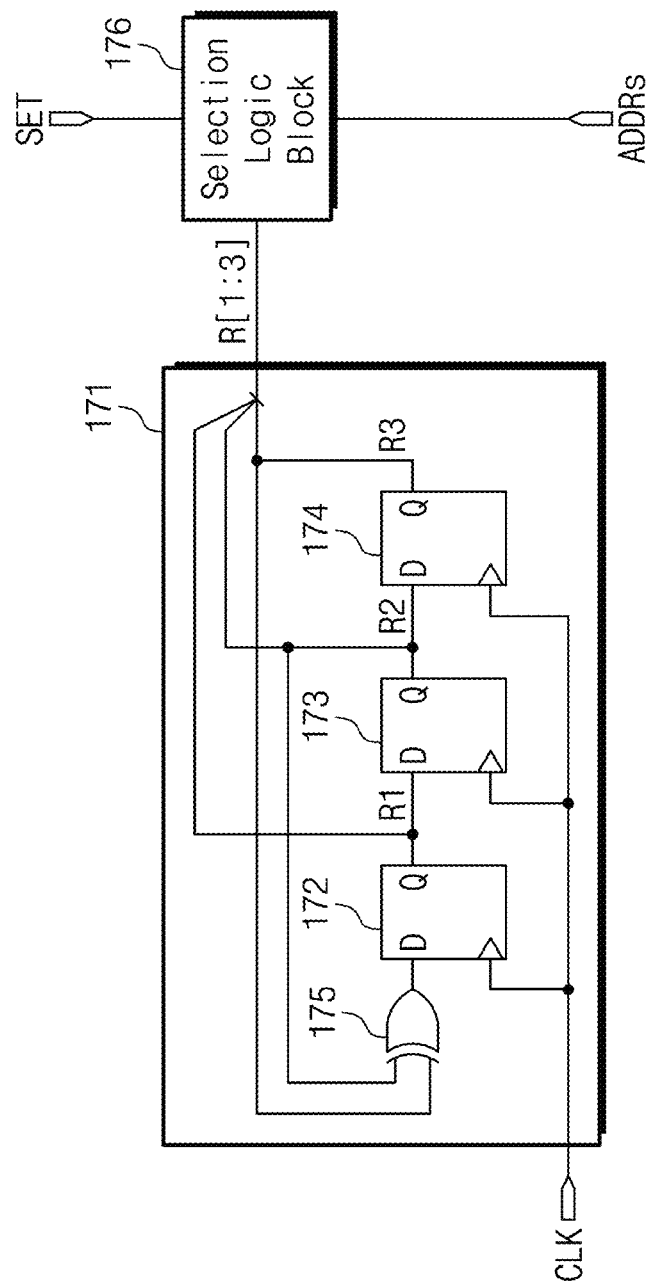
FIG. 13 illustrates an example of a prepulse selector according to example embodiments of the inventive concepts.

FIG. 13 illustrates an example of a prepulse selector according to example embodiments of the inventive concepts.

Referring to FIGS. 1 and 13, the prepulse selector 170 may include a random number generator 171 and/or a selection logic block 176. The random number generator 171 may be configured to generate a random number R[1:3]. The random number generator 171 may include first to third flipflops 172-174 (e.g., flipflop 172, flipflop 173 and flipflop 174) and a logic gate 175. According to some example embodiments, operations described herein as being performed by the prepulse selector 170 may be performed by processing circuitry.

The first to third flipflops 172-174 may operate in response to a clock signal CLK. The clock signal CLK may be generated in the nonvolatile memory device 100 and/or may be received from the external controller 220 (refer to FIG. 15).

The first to third flipflops 172-174 may be connected in series. Outputs of the first to third flipflops 172-174 may be first, second and third bits R1, R2, and R3, respectively, of the random number R[1:3]. The second and third bits R2 and R3 may be input to the logic gate 175. The logic gate 175 may perform an exclusive logic sum (XOR) operation on the second and third bits R2 and R3. An output of the logic gate 175 may be input to the first flipflop 172.

The selection logic block 176 may receive the random number R[1:3], a partial address ADDRs, and a set information SET. The partial address ADDRs may be a portion of the address ADDR. For example, the partial address ADDRs may include a portion pointing to the ground selection line among the address ADDR.

The set information SET may include information about conditions according to which the selection logic block 176 selects the second selection lines. For example, the set information SET may include the number of (e.g., quantity of) the selection lines (e.g., the number of the ground selection lines) selected as the second selection lines. The set information SET may include separately conditions about the read operation and conditions about the verify read (e.g., the verify read operation).

The selection logic block 176 may select the second selection lines to which the prepulse voltage VPRE is not to be applied among the remaining selection lines except for the first selection lines indicating the partial address ADDRs. The selection logic block 176 may select the second selection lines by calculating (e.g., based on) the random number R[1:3] and the partial address ADDRs.

For example, the set information SET may be received in a form of the set information from the controller 220 (refer to FIG. 15). The set information SET may be received along with the command of the read operation or the write operation. The set information SET may be stored in a meta region of the memory cell array 110 and may be read when the power is on (e.g., when power is supplied to the memory cell array 110).

Figure 14:
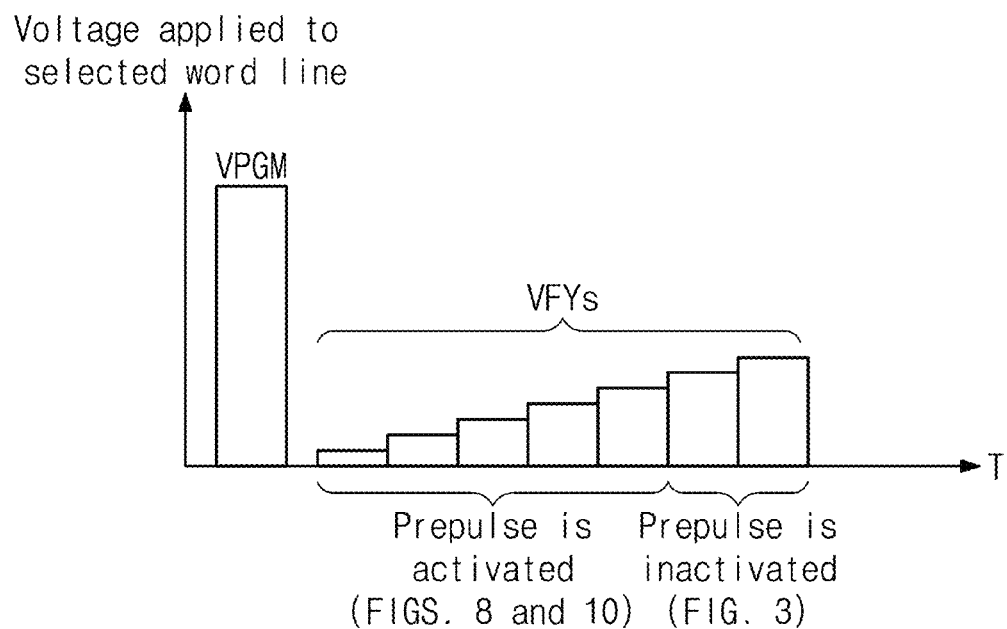
FIG. 14 illustrates an example in which a nonvolatile memory device applies a program voltage during a write operation and then performs a verify read by applying verify voltages according to example embodiments of the inventive concepts.

FIG. 14 illustrates an example in which a nonvolatile memory device applies a program voltage during a write operation and then performs a verify read by applying verify voltages according to example embodiments of the inventive concepts. In FIG. 14, a horizontal axis indicates a time T, and a vertical axis indicates a voltage applied to a selected word line WL4.

Referring to FIGS. 1, 2, and 14, the row decoder block 120 may apply a program voltage VPGM to the selected word line WL4. Thereafter, the row decoder block 120 may sequentially apply verify voltages VFYs to the selected word line WL4. When each of the verify voltages VFYs is applied, the verify read may be performed as described with reference to FIGS. 8 and 9. For example, each of the verify voltages VFYs may be applied to the selected word line WL4 instead of the read voltage VRD.

The verify voltages VFYs may have different levels. The verify voltages VFYs may respectively correspond to logic states formed in the memory cells MC4 (e.g., refer to FIG. 4). Each logic state may be a range of threshold voltages of the memory cells. A specific logic state may be written in the memory cells MC4 by setting the threshold voltages of the memory cells MC4 to be within a specific range. The verify read may be used to detect that the threshold voltages of the memory cells MC4 are within the specific range.

The data written in the memory cells MC4 may be encoded such that the number of the logic states of the memory cells MC4 may become uniform or similar. Thus, the number of the logic states corresponding to respective ones of the verify voltages VFYs may be uniform or similar.

The memory cells being in the logic state corresponding to a relatively low verify voltage may be turned on when a relatively high verify voltage is applied thereto. The memory cells being in the logic state corresponding to the relatively high verify voltage may be turned off when the relatively low verify voltage is applied thereto. As the higher level verify voltage is applied, the number of memory cells turned on among the selected memory cells MC4 may increase.

When the selected memory cells are turned on, the upper channels and the lower channels may not be separated as described with reference to FIGS. 4, 6, 9, and 12. Thus, the hot carrier may not be injected and the degradation of data may not occur.

When the nonvolatile memory device 100 according to example embodiments of the inventive concepts performs the verify read using the relatively low level verify voltages, the prepulse of the prepulse selector 170 may be activated. The prepulse voltage VPRE may be applied to some of the selection lines unselected by the address ADDR, and the prepulse voltage VPRE may not be applied to some of the remaining selection lines.

The nonvolatile memory device 100 may inactivate (e.g., not activate or deactivate) the prepulse when performing the verify read using the relatively high level verify voltages. As described with reference to FIGS. 3 and 4, the nonvolatile memory device 100 may not apply the prepulse voltage VPRE to the unselected selection lines and may apply the OFF voltage VOFF to the unselected selection lines.

FIG. 15 is a block diagram of a storage device according to example embodiments of the inventive concepts.

Referring to FIG. 15, a storage device 200 may include a nonvolatile memory device 210 and/or the controller 220. The nonvolatile memory device 210 may include the nonvolatile memory device 100 described with reference to FIG. 1. The nonvolatile memory device 210 may include a prepulse selector 211. The prepulse selector 211 may include the prepulse selector 170 described with reference to FIG. 1.

The controller 220 may transmit the command CMD and the address ADDR to the nonvolatile memory device 210 through a first channel and may exchange data DATA with the nonvolatile memory device 210. The controller 220 may transmit a control signal to the nonvolatile memory device 210 through a second channel.

The controller 220 may include an error corrector 221 and a prepulse manager 222. The error corrector 221 may drive an error correction code ECC. The error corrector 221 may detect errors from the data DATA read from the nonvolatile memory device 210 and may correct the errors. According to some example embodiments, operations described herein as being performed by any or all of the controller 220, the error corrector 221 and the prepulse manager 222 may be performed by processing circuitry.

The prepulse manager 222 may control operations related to the prepulse of the nonvolatile memory device 210. The prepulse manager 222 may generate the set information SET (refer to FIG. 13). The set information SET may be transmitted to the nonvolatile memory device 210 in a form of the command CMD, the address ADDR, or the data DATA.

The prepulse manager 222 may control whether to activate the prepulse selector 211. When the prepulse manager 222 activates the prepulse selector 211, the prepulse selector 211 may select the second selection lines to which the prepulse voltage VPRE is not applied, among the unselected selection lines, as described with reference to FIGS. 8 and 9, and/or 11 and 12.

When the prepulse manager 222 inactivates (e.g., does not activate or deactivates) the prepulse selector 211, the nonvolatile memory device 210 may perform the read operation or the verify read as described with reference to FIGS. 3 and 4, and/or 5 and 6.

For example, the prepulse selector 211 may include the selection logic block 176 (refer to FIG. 13). The random number generator 171 (refer to FIG. 13) may be included in the prepulse manager 222. The controller 220 may provide the random number R[1:3] (refer to FIG. 13) to the nonvolatile memory device 210 in a form of the command CMD, the address ADDR, or the data DATA.

Figure 16:
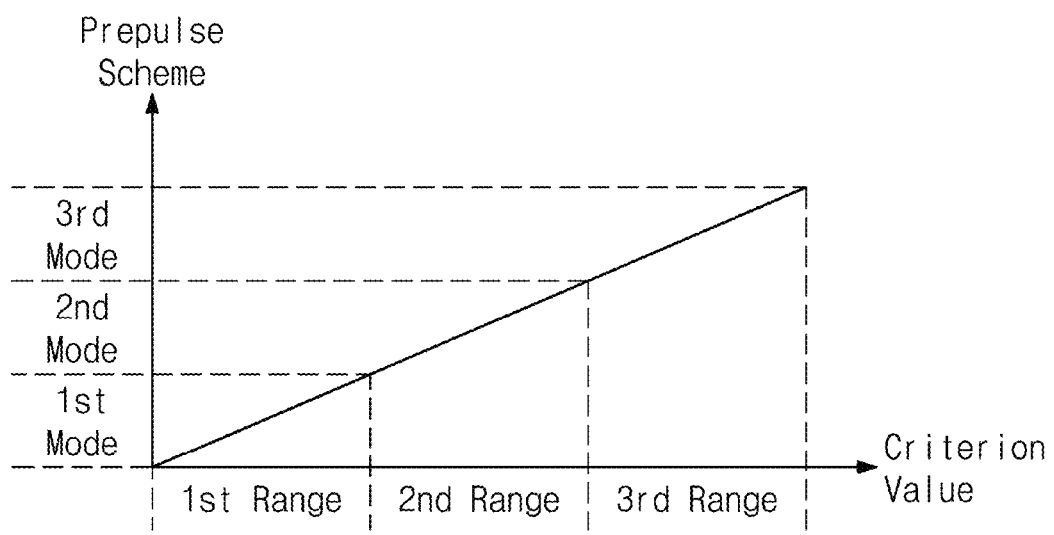
FIG. 16 illustrates an example in which a controller controls a prepulse selector according to example embodiments of the inventive concepts.

FIG. 16 illustrates an example in which a controller controls a prepulse selector according to example embodiments of the inventive concepts.

In FIG. 16, a horizontal axis indicates a criterion value, and a vertical axis indicates a prepulse scheme.

Referring to FIGS. 15 and 16, the controller 220 may control the prepulse selector 211 depending on the criterion value.

For example, the criterion value may include the number of (e.g., quantity of) read operations performed after the data is written in the memory block selected by the address ADDR. The criterion value may include the number of (e.g., quantity of) write operations and erase operations (or program and erase cycles (P/E cycle)) performed in the memory block selected by the address ADDR (e.g., a quantity of program cycles, a quantity of erase cycles, and/or a quantity of cycles in which both program and erase operations are performed). The criterion value may include a bit error rate (BER) of the data read previously in the memory block selected by the address ADDR.

When the criterion value is within the lowest first range (e.g., when the criterion value is less than a first threshold), the memory block or the data of the memory block selected by the address ADDR may be most robust (e.g., least degraded). The controller 220 may control the prepulse selector 211 in a first mode. For example, in the first mode, the prepulse selector 211 may select a first number (e.g., quantity) of selection lines as the second selection lines to which the prepulse voltage VPRE is not applied.

When the criterion value is within a second range higher than the first range (e.g., when the criterion value is higher than the first threshold and lower than a second threshold), the memory block or the data of the memory block may be in a degraded state. The controller 220 may control the prepulse selector 211 in a second mode. For example, in the second mode, the prepulse selector 211 may select a second number of selection lines as the second selection lines to which the prepulse voltage VPRE is not applied. The second number may be less than the first number.

When the criterion value is within a third range higher than the second range (e.g., when the criterion value is higher than the second threshold), the memory block or the data of the memory block selected by the address ADDR may be in the most degraded state. The controller 220 may control the prepulse selector 211 in a third mode. For example, in the third mode, the prepulse selector 211 may not select the second selection lines to which the prepulse voltage VPRE is not applied. The nonvolatile memory device 210 may perform the read operation and the verify read as described with reference to FIGS. 5 and 6. According to some example embodiments, the first and/or second thresholds may be parameters determined through empirical study or determined depending on process features, design features or environment of use.

In other words, as the degradation of the memory block or the data written in the memory block is progressed, the number of the second selection lines to which the prepulse voltage VPRE is not applied may gradually be decreased. Therefore, the reliability of the data may be improved.

In FIG. 16, it is illustrated that the relationship between the criterion value and the prepulse scheme be linear, but the inventive concepts are not limited thereto. For example, the criterion value and the prepulse scheme may have an exponential or logarithmic scale relationship.

Figure 17:
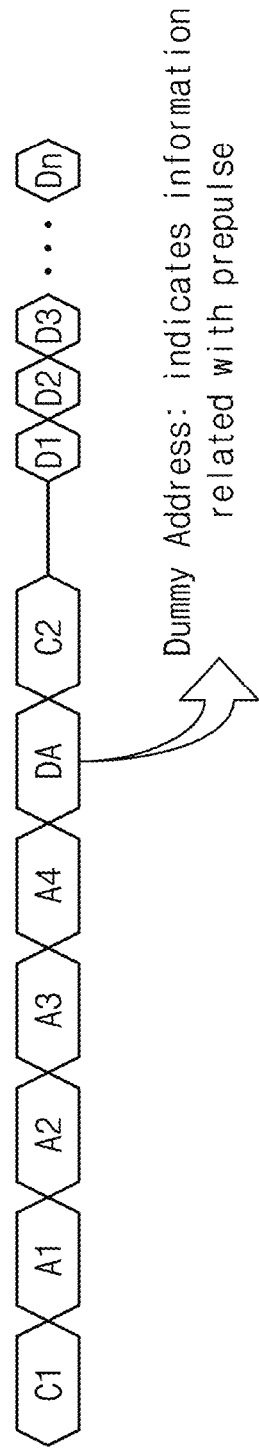
FIG. 17 illustrates an example in which a controller transmits information associated with a prepulse to a nonvolatile memory device according to example embodiments of the inventive concepts.

FIG. 17 illustrates an example in which a controller transmits information associated with a prepulse to a nonvolatile memory device according to example embodiments of the inventive concepts.

Referring to FIGS. 15 and 17, the controller 220 may transmit information associated with the prepulse as a portion of a general command sequence to the nonvolatile memory device 210.

The controller 220 may transmit a first command C1 to the nonvolatile memory device 210 according to the command sequence controlling the nonvolatile memory device 210. The first command C1 may include information about a type of the command (e.g., a read operation, read verify operation, etc.). Thereafter, the controller 220 may transmit first to fourth addresses A1~A4 (e.g., addresses A1, A2, A3 and A4) to the nonvolatile memory device 210. The first to fourth addresses A1~A4 may include row addresses and column addresses.

Thereafter, the controller 220 may transmit a dummy address DA to the nonvolatile memory device 210. The dummy address DA may include the information associated with the prepulse. The nonvolatile memory device 210 may acquire the information associated with the prepulse from the dummy address DA.

Thereafter, the controller 220 may transmit a second command C2 to the nonvolatile memory device 210. The second command C2 may be a confirm command for requesting execution of the command. The second command C2 may include additional information associated with the first command C1. Thereafter, first to nth data D1~Dn (e.g., data D1, D2, D3 . . . Dn) may be exchanged between the nonvolatile memory device 210 and the controller 220 according to the type of the first and second commands C1 and C2.

According to some example embodiments, the dummy address DA may include the set information SET (refer to FIG. 13). According to some example embodiments, the dummy address DA may include the random number R[1:3] (refer to FIG. 13). According to some example embodiments, the dummy address DA may include information indicating the activation or inactivation of the prepulse selector 211. According to some example embodiments, the dummy address DA may include an address indicating the second selection lines to which the prepulse voltage VPRE is not (e.g., should not be) applied.

As an example, the controller 220 may be changed (e.g., configured) to transmit the information associated with the prepulse to the nonvolatile memory device 210 in a form of a dummy command or dummy data rather than the dummy address DA.

As described above, the nonvolatile memory device 100 and the storage device 200 according to example embodiments of the inventive concepts may dynamically control the location and/or the number of the selection lines to which the prepulse voltage VPRE is not applied, during the read operation or the verify read. Thus, the reliability of the data may be guaranteed and/or improved, the speed of the read operation and/or the verify read may be increased, and the power consumption may be reduced.

As described above, the nonvolatile memory device 100 and the components of the storage device 200 has been described using the terms such as first, second, and third, and the like. However, the terms such as first, second, and third, and the like are used to distinguish the components from each other, but the inventive concepts are not limited thereto. For example, the terms such as first, second, and third, and the like do not contain order or any type of numeric meaning.

In above description, the components according to example embodiments of the inventive concepts has been referenced using the blocks. The blocks may be implemented in various hardware devices such as an Integrated Circuit (IC), an Application Specific IC (ASIC), a Field Programmable Gate Array (FPGA), a Complex Programmable Logic Device (CPLD), a firmware driven in hardware devices, a software such as applications, or a combination of a software and a hardware device. In addition, the blocks may include circuits composed of semiconductor devices in the IC or Intellectual Property (IP).

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A nonvolatile memory device comprising:
   a memory cell array including a plurality of cell strings arranged in rows and columns, each of the plurality of cell strings including a ground selection transistor among a plurality of ground selection transistors, one or more memory cells among a plurality of memory cells, and a string selection transistor among a plurality of string selection transistors; and
   row decoder circuitry connected to,
      the plurality of ground selection transistors through a plurality of ground selection lines,
      the plurality of memory cells through a plurality of word lines, and
      the plurality of string selection transistors through a plurality of string selection lines,
   the row decoder circuitry configured to control voltages supplied to the memory cell array during a read operation of reading data from selected memory cells among the plurality of memory cells, by,
      applying a turn on voltage to a first ground selection line selected from the plurality of ground selection lines,
      applying a turn off voltage to at least one second ground selection line selected from the plurality of ground selection lines, the at least one second ground selection line being selected from the plurality of ground selection lines based on a read address associated with the read operation, and
      applying the turn off voltage to an unselected ground selection line among the plurality of ground selection lines after applying a prepulse voltage to the unselected ground selection line.

2. The nonvolatile memory device according to claim 1, wherein the first ground selection line is selected by the read address, and the at least one second ground selection line is selected from a set of the plurality of ground selection lines excluding the first ground selection line.

3. The nonvolatile memory device according to claim 1, wherein
   each of the plurality of ground selection lines shares at least two cell strings among the plurality of cell strings with at least two string selection lines among the plurality of string selection lines; and
   the row decoder circuitry is configured to apply the turn off voltage to the at least two string selection lines sharing the at least two cell strings with the at least one second ground selection line.

4. The nonvolatile memory device according to claim 1, wherein
   each of the plurality of ground selection lines shares at least two cell strings among the plurality of cell strings with at least two string selection lines among the plurality of string selection lines; and
   the row decoder circuitry is configured to,
      apply the turn on voltage to a first string selection line selected by the read address from the at least two string selection lines sharing the at least two cell strings with the first ground selection line, and
      apply the turn off voltage to at least one second string selection line unselected by the read address from the at least two string selection lines sharing the at least two cell strings with the first ground selection line after applying the prepulse voltage to the at least one second string selection line.

5. The nonvolatile memory device according to claim 1, wherein
   each of the plurality of ground selection lines shares at least two cell strings among the plurality of cell strings with at least two string selection lines among the plurality of string selection lines; and
   the row decoder circuitry is configured to apply the turn off voltage to the at least two string selection lines sharing the at least two cell strings with the unselected ground selection line after applying the prepulse voltage to the at least two string selection lines sharing the at least two cell strings with the unselected ground selection line.

6. The nonvolatile memory device according to claim 1, wherein
   each of the plurality of ground selection lines shares at least one cell string among the plurality of cell strings with one of the plurality of string selection lines; and
   the row decoder circuitry is configured to apply the turn on voltage to the one of the string selection lines sharing the at least one cell string with the first ground selection line.

7. The nonvolatile memory device according to claim 1, wherein
   each of the plurality of ground selection lines shares at least one cell string among the plurality of cell strings with one of the plurality of string selection lines; and
   the row decoder circuitry is configured to apply the turn off voltage to the one of the string selection lines sharing the at least one cell string with the at least one second ground selection line.

8. The nonvolatile memory device according to claim 1, wherein
   each of the plurality of ground selection lines shares at least one cell string among the plurality of cell strings with one of the plurality of string selection lines; and
   the row decoder circuitry is configured to apply the turn off voltage to the one of the string selection lines sharing the at least one cell string with the unselected ground selection line after applying the prepulse voltage to the one of the string selection lines sharing the at least one cell string with the unselected ground selection line.

9. The nonvolatile memory device according to claim 1, wherein a number of second ground selection lines of the at least one second ground selection line is selected.

10. The nonvolatile memory device according to claim 1, wherein the row decoder circuitry is configured to apply the prepulse voltage and then apply the turn on voltage to the first ground selection line and apply the turn off voltage to the unselected ground selection line while applying the turn on voltage to the first ground selection line.

11. The nonvolatile memory device according to claim 1, further comprising:
a random number generator configured to generate a random number, the at least one second ground selection line being selected based on the random number.

12. The nonvolatile memory device according to claim 1, wherein
the read operation is a first verify read operation; and
the row decoder circuitry is configured to apply a first verify voltage to the selected memory cells through a selected word line among the plurality of word lines after applying a program voltage to the selected memory cells through the selected word line.

13. The nonvolatile memory device according to claim 12, wherein the first verify read operation is sequentially performed at least twice using different first verify voltage levels.

14. The nonvolatile memory device according to claim 12, wherein the row decoder circuitry is configured to control voltages supplied to the memory cell array during a second verify read operation performed after the first verify read operation, by:
applying a second verify voltage higher than the first verify voltage to the selected memory cells through the selected word line;
applying the turn on voltage to the first ground selection line; and
applying the turn off voltage to a set of ground selection lines among the plurality of ground selection lines excluding the first ground selection line.

15. The nonvolatile memory device according to claim 1, wherein
the read operation is performed in response to receiving a command;
the read address indicating the first ground selection line and a dummy address indicating the at least one second ground selection line are received with the command; and
the dummy address is selected from a set of addresses excluding the read address.

16. A storage device comprising:
a nonvolatile memory device including a plurality of memory blocks, each memory block including a plurality of memory cells and a plurality of selection transistors; and
a controller configured to transmit to the nonvolatile memory device a read command and a read address, the read address identifying a selected memory block among the plurality of memory blocks and one or more selected memory cells among the plurality of memory cells of the selected memory block,
the nonvolatile memory device including processing circuitry configured to control voltages supplied to the plurality of memory blocks in response to the read command in a first mode, by
applying a turn on voltage to a plurality of first selection transistors associated with the read address among the plurality of selection transistors,
applying a turn off voltage to a plurality of second selection transistors among the plurality of selection transistors, the plurality of second selection transistors being selected based on the read address, and
applying the turn off voltage to a plurality of third selection transistors among the plurality of selection transistors, the plurality of third selection transistors being selected based on the read address after applying a prepulse voltage to the plurality of third selection transistors.

17. The storage device according to claim 16, wherein the processing circuitry is configured to control voltages supplied to the plurality of memory blocks in response to the read command in a second mode, by:
applying the turn on voltage to the plurality of first selection transistors, and
applying the turn off voltage to a set of selection transistors among the plurality of selection transistors excluding the plurality of first selection transistors after applying the prepulse voltage to the set of selection transistors.

18. The storage device according to claim 17, wherein the controller is configured to:
control the nonvolatile memory device according to the second mode when a criterion value is higher than a threshold; and
control the nonvolatile memory device according to the first mode when the criterion value is less than the threshold, the criterion value including one of a read count, a quantity of program and erase cycles, or a bit error rate, of the selected memory block.

19. The storage device according to claim 16, wherein the controller is configured to transmit to the nonvolatile memory device a dummy address indicating a plurality of locations of the plurality of second selection transistors, or a quantity of the plurality of second selection transistors along with the read command and the read address.

20. An operating method of a nonvolatile memory device including a plurality of memory cells and a plurality of selection transistors comprising:
receiving a read command and a read address indicating one or more selected memory cells among the plurality of memory cells; and
performing a read operation in response to the read command including,
applying a turn on voltage to a plurality of first selection transistors associated with the read address among the plurality of selection transistors,
applying a turn off voltage to a plurality of second selection transistors among the plurality of selection transistors, the plurality of second selection transistors being selected based on the read address, and
applying the turn off voltage to a plurality of third selection transistors among the plurality of selection transistors, the plurality of third selection transistors being selected based on the read address after applying a prepulse voltage to the plurality of third selection transistors.

* * * * *